(12) United States Patent
Hu et al.

(10) Patent No.: US 9,768,345 B2
(45) Date of Patent: Sep. 19, 2017

(54) LED WITH CURRENT INJECTION CONFINEMENT TRENCH

(71) Applicant: LuxVue Technology Corporation, Santa Clara, CA (US)

(72) Inventors: Hsin-Hua Hu, Los Altos, CA (US); Kelly McGroddy, San Francisco, CA (US)

(73) Assignee: Apple Inc., Cupertino, CA (US)

(*) Notice: Subject to any disclaimer, the term of this patent is extended or adjusted under 35 U.S.C. 154(b) by 49 days.

(21) Appl. No.: 14/137,847

(22) Filed: Dec. 20, 2013

(65) Prior Publication Data

US 2015/0179876 A1 Jun. 25, 2015

(51) Int. Cl.

| H01L 29/06 | (2006.01) |
|---|---|
| *H01L 33/06* | (2010.01) |
| *H01L 33/20* | (2010.01) |
| *H01L 33/60* | (2010.01) |
| *H01L 33/40* | (2010.01) |
| H01L 33/62 | (2010.01) |
| H01L 33/00 | (2010.01) |
| H01L 33/14 | (2010.01) |

(52) U.S. Cl.
CPC ............ *H01L 33/06* (2013.01); *H01L 33/20* (2013.01); *H01L 33/405* (2013.01); *H01L 33/60* (2013.01); *H01L 33/0095* (2013.01); *H01L 33/14* (2013.01); *H01L 33/62* (2013.01); *H01L 2224/95* (2013.01); *H01L 2924/12044* (2013.01); *H01L 2933/0016* (2013.01)

(58) Field of Classification Search
CPC ....... H01L 33/145; H01L 33/46; H01L 33/06; H01L 33/20; H01L 33/405; H01L 33/60; H01L 33/0095; H01L 33/14; H01L 33/62; H01L 2224/95; H01L 2924/12044; H01L 2933/0016
USPC .......................................................... 257/13
See application file for complete search history.

(56) References Cited

U.S. PATENT DOCUMENTS

| 3,717,743 A | 2/1973 | Costello |
| 3,935,986 A | 2/1976 | Lattari et al. |
| 4,862,230 A | 8/1989 | Uji |
| 5,131,582 A | 7/1992 | Kaplan et al. |
| 5,378,926 A | 1/1995 | Chi et al. |
| 5,435,857 A | 7/1995 | Han et al. |

(Continued)

FOREIGN PATENT DOCUMENTS

| EP | 2 608 262 A1 | 6/2013 |
| JP | S59 119775 A | 7/1984 |

(Continued)

OTHER PUBLICATIONS

Simpson and Weiner, "The Oxford English Dictionary", 1989, Clarendon Press, V 20.*

(Continued)

*Primary Examiner* — Trung Q Dang
*Assistant Examiner* — Patricia Reddington
(74) *Attorney, Agent, or Firm* — Blakely, Sokoloff, Taylor & Zafman LLP

(57) ABSTRACT

A method and structure for forming an array of LED devices is disclosed. The LED devices in accordance with embodiments of the invention may include a confined current injection area, embedded mirror, or sidewall passivation layer, and any combination thereof.

9 Claims, 31 Drawing Sheets

(56) References Cited

U.S. PATENT DOCUMENTS

| | | | |
|---|---|---|---|
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,177,767 B1 | 1/2001 | Asai et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 6,929,966 B2 | 8/2005 | Illek et al. |
| 6,995,030 B2 | 2/2006 | Illek et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,585,703 B2 | 9/2009 | Matsumura et al. |
| 7,628,309 B1 | 12/2009 | Erikssen et al. |
| 7,714,336 B2 | 5/2010 | Imai |
| 7,723,764 B2 | 5/2010 | Oohata et al. |
| 7,795,629 B2 * | 9/2010 | Watanabe | H01L 21/6835 257/89 |
| 7,797,820 B2 | 9/2010 | Shida et al. |
| 7,838,410 B2 * | 11/2010 | Hirao | H01L 21/6835 257/E21.006 |
| 7,843,060 B2 | 11/2010 | Edmond |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,426,227 B1 | 4/2013 | Bibl et al. |
| 8,502,465 B2 | 8/2013 | Katona et al. |
| 8,518,204 B2 | 8/2013 | Hu et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0303713 A1 | 12/2009 | Chang et al. |
| 2009/0309514 A1 * | 12/2009 | Kim | H01L 33/62 315/291 |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 * | 3/2011 | Wang | H01L 33/20 257/94 |
| 2011/0096061 A1 | 4/2011 | Lin et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0266568 A1 * | 11/2011 | Aldaz | H01L 33/145 257/98 |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0021228 A1 | 1/2013 | Miwa et al. |
| 2013/0038416 A1 | 2/2013 | Arai et al. |
| 2013/0130440 A1 * | 5/2013 | Hu | H01L 24/83 438/107 |
| 2013/0134591 A1 | 5/2013 | Sakamoto et al. |
| 2013/0161682 A1 | 6/2013 | Liang et al. |
| 2013/0210194 A1 | 8/2013 | Bibl et al. |
| 2013/0228744 A1 | 9/2013 | Kazama |

FOREIGN PATENT DOCUMENTS

| | | |
|---|---|---|
| JP | S61 121373 A | 6/1986 |
| JP | S61 125092 A | 6/1986 |
| JP | 07-060675 A | 3/1995 |
| JP | H07 106631 A | 4/1995 |
| JP | 11-142878 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |

(56) References Cited

FOREIGN PATENT DOCUMENTS

| KR | 10-0610632 B1 | 8/2006 |
|---|---|---|
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, 8-12, Oct, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Dai et al, "On the symmetry of efficiency-versus-carrier-concentration curves in GaInN/GaN light-emitting diodes and relation to droop-causing mechanisms" American Institute of Physics, Applied Physics Letters 94, 033506, Jan. 20, 2011, 3 pgs.

Keeping, Steven, "Identifying the Causes of LED Efficiency Droop Electronic Products" Web. http://www.digikey.com/us/en/techzone/lighting/resources/articles/identifying-the-causes-of-led-efficiency-droop.html, accessed Nov. 19, 2013, 3 pgs.

Dawson, et al., "The Impact of the Transient Response of Organic Light Emitting Diodes on the Design of Active Matrix OLED Displays," IEEE, IEDM 98, 1998, pp. 875-878.

Levy, et al., "An 852×600 Pixel OLED-on-Silicon Color MIcrodisplay Using CMOS Subthreshold-Voltage-Scaling Current Drivers," IEEE Journal of Solid-State Circuits, vol. 37, No. 12, Dec. 2002, pp. 1879-1889.

PCT International Search Report and Written Opinion for International Application No. PCT/US2014/067186, mailed Feb. 19, 2015, 9 pages.

\* cited by examiner

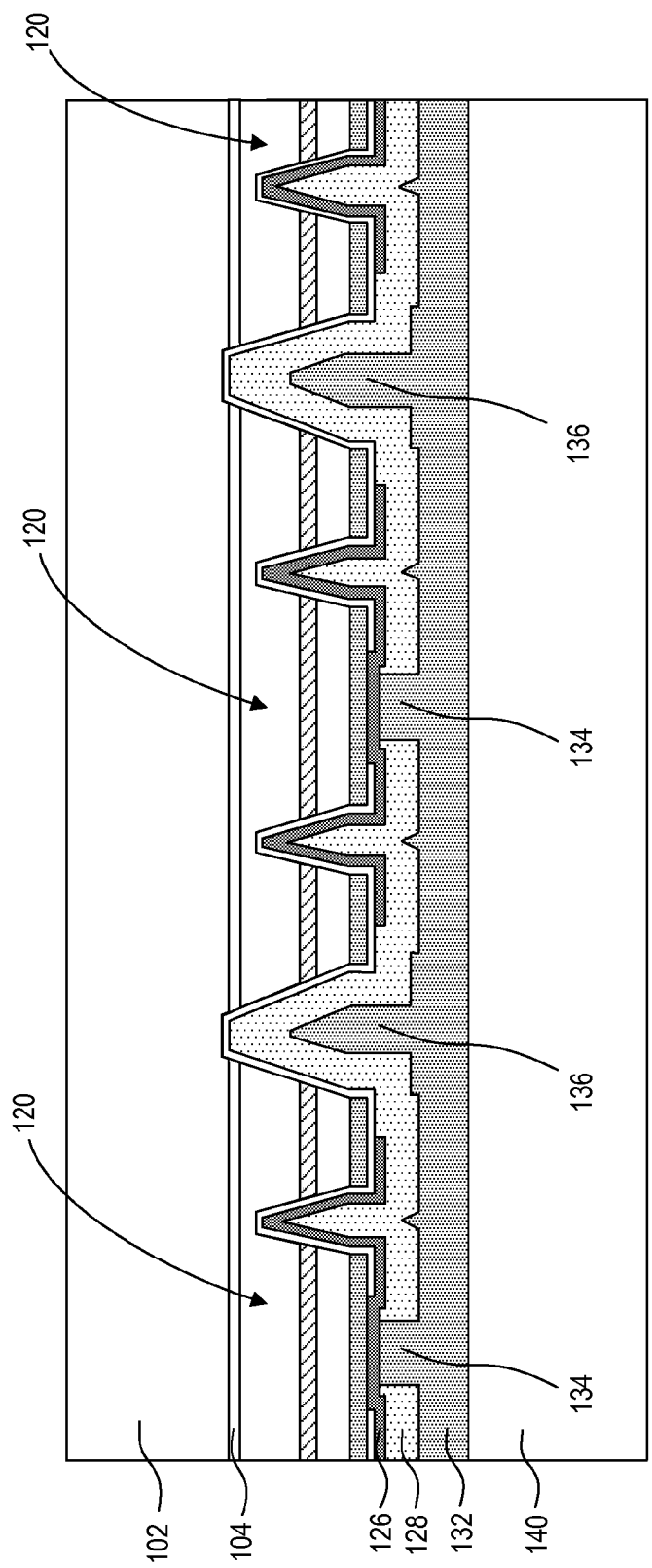

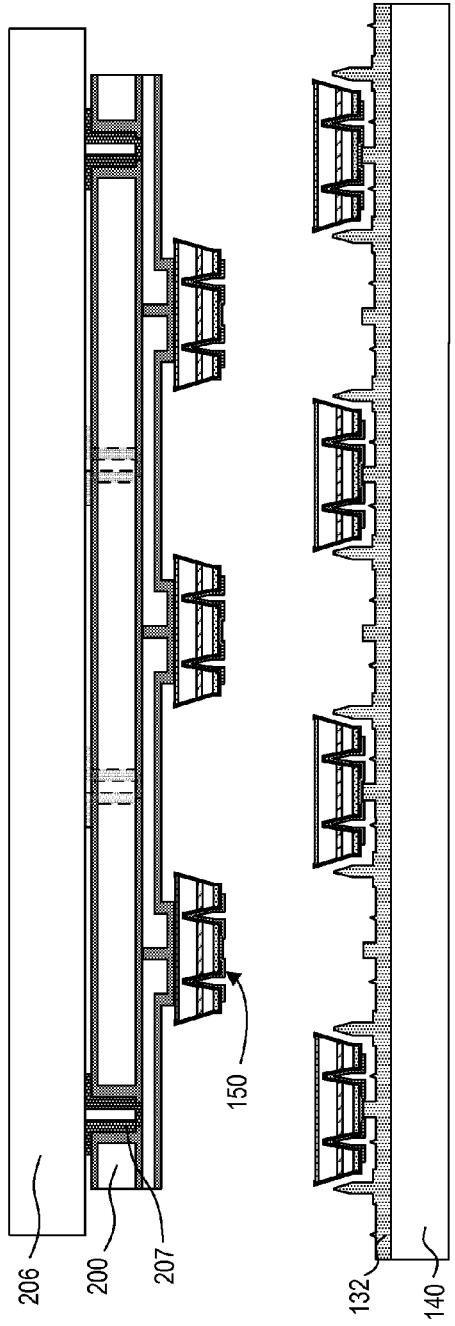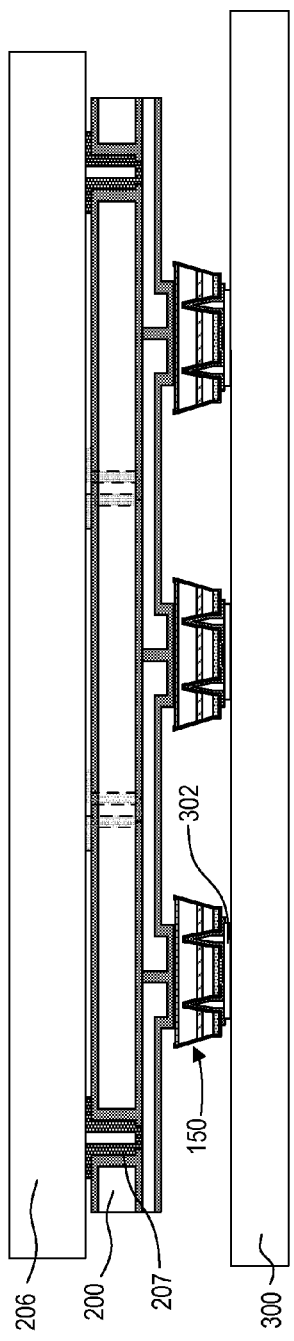

LED WITH CURRENT INJECTION CONFINEMENT TRENCH

BACKGROUND

Field

The present invention relates to light emitting diode (LED) devices.

Background Information

Light emitting diodes (LEDs) are increasingly being considered as a replacement technology for existing light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

One type of LED is an organic light emitting diode (OLED) in which the emissive layer of the diode is formed of an organic compound. One advantage of OLEDs is the ability to print the organic emissive layer on flexible substrates. OLEDs have been integrated into thin, flexible displays and are often used to make the displays for portable electronic devices such as cell phones and digital cameras.

Another type of LED is a semiconductor-based LED in which the emissive layer of the diode includes one or more semiconductor-based quantum well layers sandwiched between thicker semiconductor-based cladding layers. Some advantages of semiconductor-based LEDs compared to OLEDs can include increased efficiency and longer lifespan. High luminous efficacy, expressed in lumens per watt (lm/W), is one of the main advantages of semiconductor-based LED lighting, allowing lower energy or power usage compared to other light sources. Luminance (brightness) is the amount of light emitted per unit area of the light source in a given direction and is measured in candela per square meter ($cd/m^2$) and is also commonly referred to as a Nit (nt). Luminance increases with increasing operating current, yet the luminous efficacy is dependent on the current density ($A/cm^2$), increasing initially as current density increases, reaching a maximum and then decreasing due to a phenomenon known as "efficiency droop." Many factors contribute to the luminous efficacy of an LED device, including the ability to internally generate photons, known as internal quantum efficiency (IQE). Internal quantum efficiency is a function of the quality and structure of the LED device. External quantum efficiency (EQE) is defined as light output divided by the electrical input power. EQE is a function of IQE and the light extraction efficiency of the LED device. At low operating current density (also called injection current density, or forward current density) the IQE and EQE of an LED device initially increases as operating current density is increased, then begins to tail off as the operating current density is increased in the phenomenon known as the efficiency droop. At low current density the efficiency is low due to the strong effect of defects or other processes by which electrons and holes recombine without the generation of light, called non-radiative recombination. As those defects become saturated radiative recombination dominates and efficiency increases. An "efficiency droop" or gradual decrease in efficiency begins as the injection-current density surpasses a low value, typically between 1.0 and 10 $A/cm^2$.

Semiconductor-based LEDs are commonly found in a variety of applications, including low-power LEDs used as indicators and signage, medium-power LEDs such as for light panels and automotive tail lights, and high-power LEDs such as for solid-state lighting and liquid crystal display (LCD) backlighting. In one application, high-powered semiconductor-based LED lighting devices may commonly operate at 400-1,500 mA, and may exhibit a luminance of greater than 1,000,000 $cd/m^2$. High-powered semiconductor-based LED lighting devices typically operate at current densities well to the right of peak efficiency on the efficiency curve characteristic of the LED device. Low-powered semiconductor-based LED indicator and signage applications often exhibit a luminance of approximately 100 $cd/m^2$ at operating currents of approximately 20-100 mA. Low-powered semiconductor-based LED lighting devices typically operate at current densities at or to the right of the peak efficiency on the efficiency curve characteristic of the LED device. To provide increased light emission, LED die sizes have been increased, with a 1 $mm^2$ die becoming a fairly common size. Larger LED die sizes can result in reduced current density, which in turn may allow for use of higher currents from hundreds of mA to more than an ampere, thereby lessening the effect of the efficiency droop associated with the LED die at these higher currents.

Thus, the trend in current state-of-the art semiconductor-based LEDs is to increase both the operating current as well as LED size in order to increase efficiency of LEDs since increasing the LED size results in decreased current density and less efficiency droop. At the moment, commercial semiconductor-based LEDs do not get much smaller than 1 $mm^2$.

SUMMARY

LED devices and manners of forming LED devices with a confined current injection area, embedded mirror, and/or passivation layer are disclosed. In an embodiment, an LED device includes a p-n diode layer including a top surface and a bottom surface that includes an interior bottom surface and a surrounding bottom surface. External sidewalls extend between the top surface and the surrounding bottom surface. A quantum well layer is located between an n-doped layer and a p-doped layer of the p-n diode layer. A confinement trench extends from the bottom surface of the p-n diode layer through the quantum well layer and physically isolates an interior portion of the quantum well layer from a surrounding portion of the quantum well layer adjacent the external sidewalls. The confinement trench also physically isolates the interior bottom surface of the p-n diode layer from the surrounding bottom surface of the p-n diode layer adjacent the external sidewalls. A bottom electrically conductive contact is on and in electrical contact with the interior bottom surface of the p-n diode layer, and is not in electrical contact with the surrounding bottom surface of the p-n diode layer. In this manner, the current injection area of the LED device is confined to the interior portion of the p-n diode layer.

A mirror layer may be formed on the LED device spanning along the interior bottom surface and along confinement trench sidewalls within the confinement trench. In an embodiment, the mirror layer does not span along the external sidewalls of the p-n diode layer. A passivation layer may be formed between the mirror layer and the confinement trench sidewalls. In an embodiment, the passivation layer also spans along the external sidewalls of the p-n diode layer. An opening may be formed in the passivation on the interior bottom surface of the p-n diode layer. In an embodiment, the mirror layer is formed within the opening of the passivation layer on the interior bottom surface of the p-n diode layer.

A top surface area of the top surface of the p-n diode layer may be larger than a surface area of the interior bottom surface of the p-n diode layer surrounded by the confinement trench. In an embodiment, the LED device is supported by a post, and a surface area of a top surface of the post is less than a surface area of the interior bottom surface of the p-n diode layer surrounded by the confinement trench. LED devices in accordance with embodiments of the invention may be incorporated into a variety of lighting or display applications, such as a display area of a portable electronic device.

In an embodiment, a method of forming an LED device array includes patterning a p-n diode layer to form an array of mesa structures separated by an array of mesa trenches, and a corresponding array of confinement trenches within the array of mesa structures. The confinement trenches extend through a quantum well layer in each of the mesa structures and physically isolate an interior bottom surface of the p-n diode layer from a surrounding bottom surface of the p-n diode layer in each mesa structure. An array of bottom electrically conductive contact is formed on an in electrical contact with the array of interior bottom surfaces without being in electrical contact with the corresponding surrounding bottom surface of the p-n diode layer for each respective mesa structure. The patterned p-n diode layer is then bonded to a carrier substrate, and a handle substrate is removed from the patterned p-n diode layer. In an embodiment, a conductive contact layer may be deposited on the p-n diode layer prior to patterning the p-n diode layer to form the array of mesa structures and prior to forming an array of bottom electrically conductive contacts.

A patterned mirror layer may be formed on the array of mesa structures and within the array of confinement trenches. For example, a photoresists lift-off technique may be used in an embodiment. A sacrificial release layer may be deposited over the array of mesa structure, and patterned to form an array of openings in the sacrificial release layer over an array of the interior bottom surfaces of the p-n diode layer. After patterning the sacrificial release layer, the handle substrate including the sacrificial release layer is bonded to a carrier substrate with a bonding material such that the bonding material is located within the array of openings in the sacrificial release layer.

In an embodiment, a passivation layer is deposited on the array of bottom electrically conductive contacts and within the array of mesa trenches and within the array of confinement trenches. In an embodiment, the passivation layer is deposited using atomic layer deposition. In an embodiment, annealing may is performed to form ohmic contacts between the array of bottom electrically conductive contacts and the array of mesa structures after patterning the p-n diode layer to form the array of mesa trenches and the corresponding array of confinement trenches. In an embodiment an array of openings are formed in the passivation layer, and a patterned mirror layer is formed on the array of mesa structures, within the array of openings in the passivation layer, and within the array of confinement trenches.

In an embodiment, a method of operating a display, such as a portable electronic device, includes sending a control signal to a driving transistor and driving a current through an LED device including a confined current injection area in response to the control signal. The LED device comprises a confinement trench that extends through a quantum well layer and physically isolates an interior portion of the quantum well layer from a surrounding portion of the quantum well layer adjacent external sidewalls of the LED device. In an embodiment, the current is from 1 nA-400 nA. The current flowing through the device may depend upon resolution of the display and brightness. In an embodiment the current is from 1 nA-30 nA. For example, a corresponding current density may be from 0.001 $A/cm^2$ to 3 $A/cm^2$. In an embodiment the current is from 200 nA-400 nA. For example, a corresponding current density may be from 0.2 $A/cm^2$ to 4 $A/cm^2$. In an embodiment the current is from 100 nA-300 nA. For example, a corresponding current density may be from 0.01 $A/cm^2$-30 $A/cm^2$.

BRIEF DESCRIPTION OF THE DRAWINGS

FIG. 9A-9B are cross-sectional side view illustrations of a patterned bulk LED substrate bonded to a carrier substrate with a stabilization layer in accordance with embodiments of the invention.

FIG. 17A-17E are cross-sectional side view illustrations of an array of electrostatic transfer heads transferring LED devices from carrier substrate to a receiving substrate in accordance with an embodiment of the invention.

DETAILED DESCRIPTION OF THE INVENTION

Figure 1:
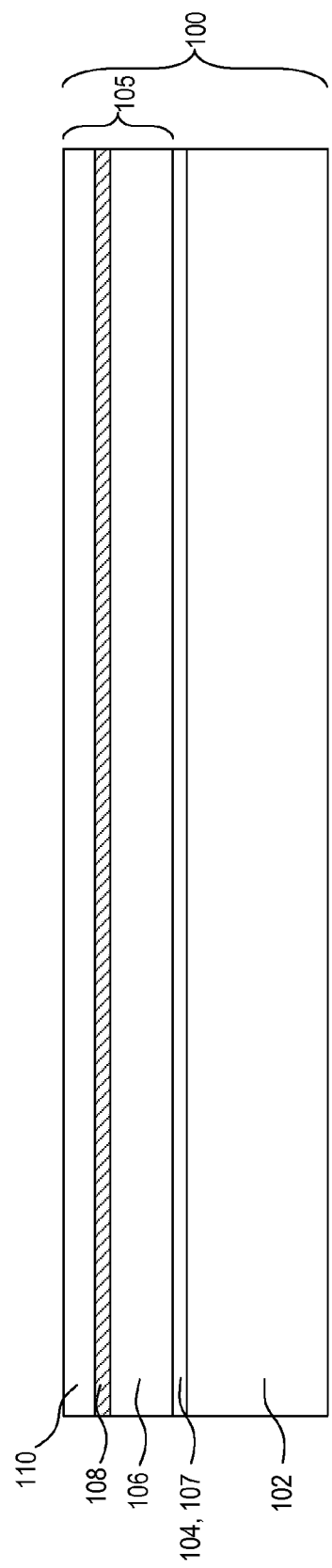
FIG. 1 is a cross-sectional side view illustration of a bulk LED substrate in accordance with an embodiment of the invention.

Embodiments of the present invention describe LED devices and manners of forming LED devices with a confined current injection area, embedded mirror, and/or passivation layer. In particular, some embodiments of the present invention may relate to micro LED devices and manners of forming micro LED devices with a confined current injection area, embedded mirror, and/or passivation layer.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning," "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments of the invention describe an LED device integration design in which an LED device is transferred from a carrier substrate and bonded to a receiving substrate using an electrostatic transfer head assembly. In accordance with embodiments of the present invention, a pull-in voltage is applied to an electrostatic transfer head in order to generate a grip pressure on an LED device. It has been observed that it can be difficult to impossible to generate sufficient grip pressure to pick up micro devices with vacuum chucking equipment when micro device sizes are reduced below a specific critical dimension of the vacuum chucking equipment, such as approximately 300 μm or less, or more specifically approximately 100 μm or less. Furthermore, electrostatic transfer heads in accordance with embodiments of the invention can be used to create grip pressures much larger than the 1 atm of pressure associated with vacuum chucking equipment. For example, grip pressures of 2 atm or greater, or even 20 atm or greater may be used in accordance with embodiments of the invention. Accordingly, in one aspect, embodiments of the invention provide the ability to transfer and integrate micro LED devices into applications in which integration is not possible with current vacuum chucking equipment. In some embodiments, the term "micro" LED device or structure as used herein may refer to the descriptive size, e.g. length or width, of certain devices or structures. In some embodiments, "micro" LED devices or structures may be on the scale of 1 μm to approximately 300 μm, or 100 μm or less in many applications. However, it is to be appreciated that embodiments of the present invention are not necessarily so limited, and that certain aspects of the embodiments may be applicable to larger micro LED devices or structures, and possibly smaller size scales.

In one aspect, embodiments of the invention describe LED devices that are poised for pick up and supported by one or more stabilization posts. In accordance with embodiments of the present invention, a pull-in voltage is applied to a transfer head in order to generate a grip pressure on an LED an LED device and pick up the LED device. In accordance with embodiments of the invention, the minimum amount pick up pressure required to pick up an LED device from a stabilization post can be determined by the adhesion strength between the adhesive bonding material from which the stabilization posts are formed and the LED device (or any intermediate layer), as well as the contact area between the top surface of the stabilization post and the LED device. For example, adhesion strength which must be overcome to pick up an LED device is related to the minimum pick up pressure generated by a transfer head as provided in equation (1):

$$P_1 A_1 = P_2 A_2 \quad (1)$$

where $P_1$ is the minimum grip pressure required to be generated by a transfer head, $A_1$ is the contact area between a transfer head contact surface and LED device contact surface, $A_2$ is the contact area on a top surface of a stabilization post, and $P_2$ is the adhesion strength on the top surface of a stabilization post. In an embodiment, a grip pressure of greater than 1 atmosphere is generated by a transfer head. For example, each transfer head may generate a grip pressure of 2 atmospheres or greater, or even 20 atmospheres or greater without shorting due to dielectric breakdown of the transfer heads. Due to the smaller area, a higher pressure is realized at the top surface of the corresponding stabilization post than the grip pressure generate by a transfer head.

In another aspect, embodiments of the invention describe LED devices, which may be micro LED devices, including a confined current injection area. In an embodiment, an LED device includes a p-n diode layer including a top surface and a bottom surface including an interior bottom surface and a surrounding bottom surface. External sidewalls extend between the top surface and the surrounding bottom surface, and a quantum well layer is between an n-doped layer and a p-doped layer of the p-n diode layer. A confinement trench extends from the bottom surface of the p-n diode layer through the quantum well layer and physically isolates an interior portion of the quantum well layer from a surrounding portion of the quantum well layer adjacent the external sidewalls of the p-n diode layer, as well as physically isolates the interior bottom surface of the p-n diode layer from the surrounding bottom surface of the p-n diode layer adjacent the external sidewalls. A bottom electrically conductive contact located on the interior bottom surface is in electrical contact with the interior bottom surface and is not in electrical contact with the surrounding bottom surface of the p-n diode layer so as to confine the current injection area to the interior portion of the LED device. In this manner, it is possible to design an LED device in which a top surface area of the top surface of the p-n diode layer is larger than a surface area of the interior bottom surface of the p-n diode layer that is surrounded by the confinement trench. This enables larger LED devices to be fabricated, which may be beneficial for transferring the LED devices using an electrostatic transfer head assembly, while also providing a structure in which the confined current injection area results in an increased current density and increased efficiency of the LED device, particularly when operating at injection currents and injection current densities below or near the pre-droop region of the LED device internal quantum efficiency curve, since the current injection area is confined to the interior portion of the quantum well layer defined by the confinement trench location.

The LED devices in accordance with embodiments of the invention are highly efficient at light emission and may consume very little power compared to LCD or OLED display technologies. For example, a conventional display panel may achieve a full white screen luminance of 100-750 cd/m². It is understood that a luminance of greater than 686 cd/m² may be required for sunlight readable screens. In accordance with some embodiments of the invention, an LED device may be transferred and bonded to a display backplane such as a thin film substrate backplane used for OLED display panels, where the semiconductor-based LED device replaces the organic LED film of the OLED display. In this manner, a highly efficient semiconductor-based LED device replaces a less efficient organic LED film. Furthermore, the width/length of the semiconductor-based LED device may be much less than the allocated subpixel area of the display panel, which is typically filled with the organic LED film.

Figure 21:
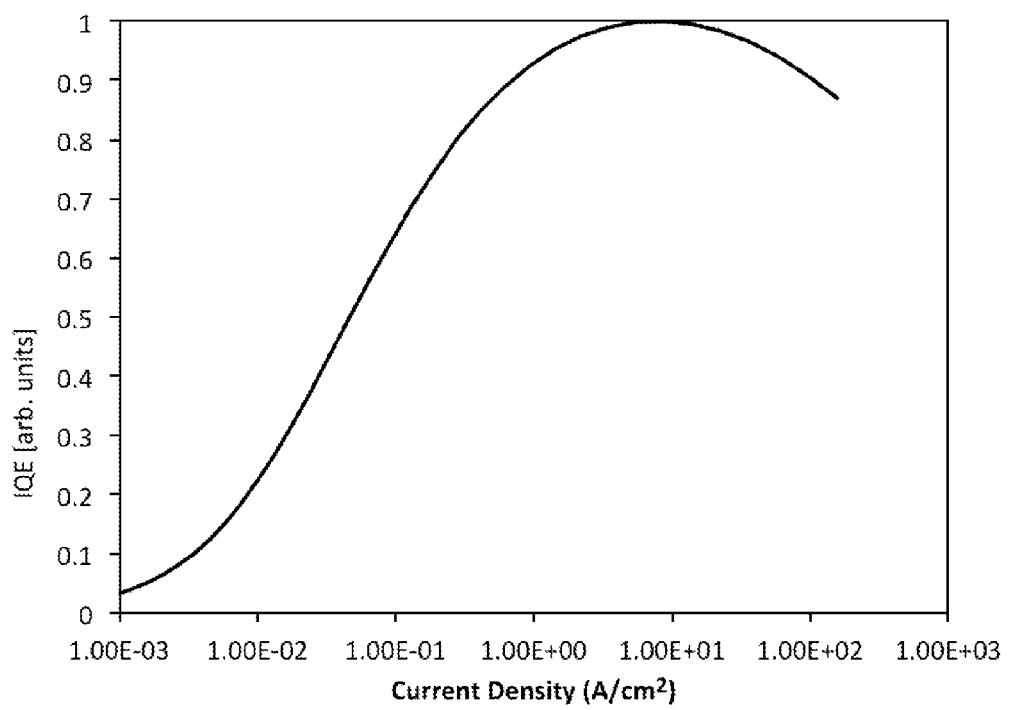
FIG. 21 is a graphical illustration of the relationship of internal quantum efficiency to current density for an LED device in accordance with embodiments of the invention.

For illustrative purposes, in accordance with embodiments of the invention it is contemplated that the LED devices may be driven using a similar driving circuitry as a conventional OLED display panel, for example a thin film transistor (TFT) backplane. However, embodiments are not so limited. For example, in another embodiment the LED devices are driven by micro controller chips that are also electrostatically transferred to a receiving substrate. Assuming subpixel operating characteristics of 25 nA injection current, an exemplary LED device having a 1 µm² confined current injection area roughly corresponds to a current density of 2.5 A/cm², an exemplary LED device having a 25 µm² confined current injection area roughly corresponds to a current density of 0.1 A/cm², and an exemplary LED device having a 100 µm² confined current injection area roughly corresponds to a current density of 0.025 A/cm². Referring to FIG. 21, in accordance with embodiments of the invention these low injection currents and current densities may correspond to a pre-droop region of a characteristic efficiency curve or a region of the efficiency curve at or just past the maximum IQE for the LED devices. This is well below the normal or designed operating conditions for standard LEDs. Furthermore, in some embodiments, the low injection currents and current densities may correspond to a portion on the pre-droop region of the characteristic efficiency curve for the LED device in which the slope of the curve is greater than 1:1 such that a small increase in current density results in a greater increase in IQE, and hence EQE, of the LED device. Accordingly, in accordance with embodiments of the invention, significant efficiency increases may be obtained by confining the current injection area of the LED device, resulting in increased luminous efficacy and luminance of the LED device. In some embodiments, LED devices with confined current injection areas are implemented into display panel applications designed for target luminance values of approximately 300 Nit for indoor display applications and greater than 686 cd/m² for outdoor display applications. In some embodiments, the embedded mirrors may additionally change the emission profile of the LED devices, further increasing the luminance of an LED device. It is to be appreciated that the above examples, including injection currents and display applications are exemplary in nature in order to provide a context for implementing embodiments of the invention, and that embodiments are not so limited and may be used with other operating conditions, and that embodiments are not limited to display applications or TFT backplanes.

In another aspect, embodiments of the invention describe LED devices including an embedded mirror. In an embodiment, an LED device, which may be a micro LED device, includes a mirror layer spanning along an interior bottom surface of the p-n diode layer surrounded by the confinement trench and along sidewalls within the confinement trench. A passivation layer may be formed between the mirror layer and the confinement trench sidewalls to prevent shorting between the p-doped layer and the n-doped layer of the p-n diode layer. Embedding the mirror layer within the p-n diode layer of the LED device may increase light extraction from the LED device since the mirror layer is directly adjacent the quantum well layer. By moving the mirror closer to the quantum well layer, where a majority of the light emission may occur, this reduces light absorbance from intermediate materials used for passivation or packaging around the LED device, for example when an external mirror is used outside of an LED device. In an embodiment, the embedded mirror is directly adjacent an interior portion of the quantum well layer corresponding to a confined current injection area. In this manner the mirror layer is able to reflect light emitted from the interior portion of the LED device so that it is not required for the light to pass through the surrounding portion of the LED device which may be absorbing. The embedded mirror may also improve contrast of the lighting or display application since the embedded mirror may reflect less ambient light than a configuration including an external mirror.

In one aspect, embodiments of the invention describe an LED device integration scheme in which LED devices including an embedded mirror are integrated into a display panel in which external mirror layers not provided on the display substrate to reflect light from the LED devices. It has been observed that display substrate mirrors used for reflecting light from LED devices may also reflect ambient light. For example, circular polarizers may be used in emissive displays to enhance readability and suppress ambient light reflection. It has been observed that while circular polarizers may suppress ambient light reflection, they may also absorb light emitted from an emissive display. In accordance with some embodiments of the invention, a circular polarizer may not be required to suppress ambient light reflection. As a result, display panels in accordance with embodiments of the invention may be packaged without a circular polarizer, resulting in increased luminance of the display panel.

In yet another aspect, embodiments of the invention describe LED devices, which may be micro LED devices, including a sidewall passivation layer. The sidewall passivation layer may span sidewalls of the p-n diode layer, including the confinement trench sidewalls and external sidewalls of the p-n diode layer. The sidewall passivation layer may protect the quantum well from other materials that could degrade or short the LED device as well as terminate dangling bonds on the exposed surface. In an embodiment, the sidewall passivation layer may also be used to passivate surface states on the sidewalls of the LED device (e.g. along confinement trench sidewalls) to improve the IQE of the LED device, and reduce non-radiative recombination along those sidewalls. In an embodiment, the sidewall passivation layer may protect the LED device from a conductive material used as an electrical contact (e.g. anode or cathode) to the top surface of the p-n diode layer. The sidewall passivation layer can also provide passivation between the LED devices while retained on the carrier substrate and protect against potential arcing between LED devices during electrostatic transfer. In some embodiments the sidewall passivation layer is formed within the confinement trench to electrically insulate the p-n diode layer from the mirror layer within the confinement trench. In this manner, the sidewall passivation layer can be patterned to assist with confining the current injection area through the interior portion of the quantum well layer.

In the following description exemplary processing sequences are described for forming an array of LED devices, which may be micro LED devices. Specifically, exemplary primary processing sequences are described for forming an array of red emitting LED devices, while supplementary descriptions and figures are provided for blue or green emitting LED devices. It is to be appreciated that the exemplary processing sequences for red, blue, and green emitting LED device may share similar features and methods. Where possible, similar features are illustrated with similar annotations in the figures and following description. While the primary processing sequences are described for red emitting LED devices, it is to be understood that the exemplary processing sequences can be used for LED devices with different emission spectra, and that certain modifications are contemplated, particularly when processing different materials. Accordingly, it is to be understood that embodiments of the invention describing the formation and transfer of LED devices including a confined current injection area, an embedded mirror layer, and/or a sidewall passivation layer are not limited to red, blue, or green emitting LED devices.

Referring now to FIG. 1, a cross-sectional side view illustration is provided of a bulk LED substrate 100 in accordance with an embodiment of the invention. For example, the bulk LED substrate illustrated in FIG. 1 may be designed for emission of red light (e.g. 620-750 nm wavelength), green light (e.g. 495-570 nm wavelength), or blue light (e.g. 450-495 nm wavelength), though embodiments of the invention are not limited to these exemplary emission spectra.

In an embodiment, a bulk LED substrate 100 includes a p-n diode layer 105 formed on a growth substrate 102. An optional etch stop layer 104 or buffer layer 107 may be formed between the p-n diode layer 105 depending upon the materials selection and color emission spectra of the p-n diode layer 105. The p-n diode layer 105 may include a doped semiconductor layer 106 (e.g. n-doped), one or more quantum well layers 108, and a doped semiconductor layer 110 (e.g. p-doped). The p-n diode layer 105 may optionally include an ohmic layer between the doped semiconductor layer 106 and the growth substrate 102 to aid in the subsequent formation of an ohmic contact with the p-n diode layer. The etch stop layer 104 or buffer layer 107 and p-n diode layer 105 may be formed on the growth substrate 102 by a variety of techniques. In an embodiment, the etch stop layer 104 or buffer layer 107 and p-n diode layer 105 are formed by one or more heterogeneous epitaxial growth techniques.

The p-n diode layer 105 may be formed of a variety of compound semiconductors having a bandgap corresponding to a specific region in the spectrum. For example, the p-n diode layer 105 can include one or more layers based on II-VI materials (e.g. ZnSe) or III-V materials including III-V nitride materials (e.g. GaN, AlN, InN, InGaN, and their alloys) and III-V phosphide materials (e.g. GaP, AlGaInP, and their alloys). The growth substrate 102 may include any suitable substrate such as, but not limited to, silicon, SiC, GaAs, GaN, and sapphire.

Referring to FIG. 1, in one embodiment, the bulk LED substrate 100 is designed for emission of red light. In such an embodiment the handle substrate 102 is a growth substrate formed of GaAs, and may be approximately 500 μm thick. The etch stop layer 104 may be formed of InGaP and approximately 2,000 angstroms thick. The ohmic layer may be formed of GaAs and approximately 500 angstroms thick. In an embodiment, n-doped layer 106 is formed of AlGaInP, and is approximately 1 μm to 3 μm thick. The one or more quantum well layers 108 may have a thickness of approximately 0.5 μm. In an embodiment, p-doped layer 110 is formed of GaP, and is approximately 1 μm to 2 μm thick.

The following embodiments are not limited to the formation of red emitting LED devices and may also be applicable to the formation of other LED devices such as green emitting LED devices formed of materials such as indium gallium nitride (InGaN), gallium nitride (GaN), gallium phosphide (GaP), aluminum gallium indium phosphide (AlGaInP), and aluminum gallium phosphide (AlGaP), or blue emitting LED devices formed of materials such as gallium nitride (GaN), indium gallium nitride (InGaN), and zinc selenide (ZnSe).

Still referring to FIG. 1, in an embodiment, the bulk LED substrate 100 is designed for emission of blue or green light, the handle substrate 102 is a growth substrate formed of sapphire, and may be approximately 200 μm thick. The buffer layer 107 is formed of GaN and has a thickness of approximately 0.5 μm to 5 μm. In an embodiment, n-doped layer 106 is formed of GaN, and is approximately 0.1 μm to 3 μm thick. The one or more quantum well layers 108 may have a thickness of approximately 0.3 μm. In an embodiment, p-doped layer 110 is formed of GaN, and is approximately 0.1 μm to 1 μm thick.

Figure 2A:
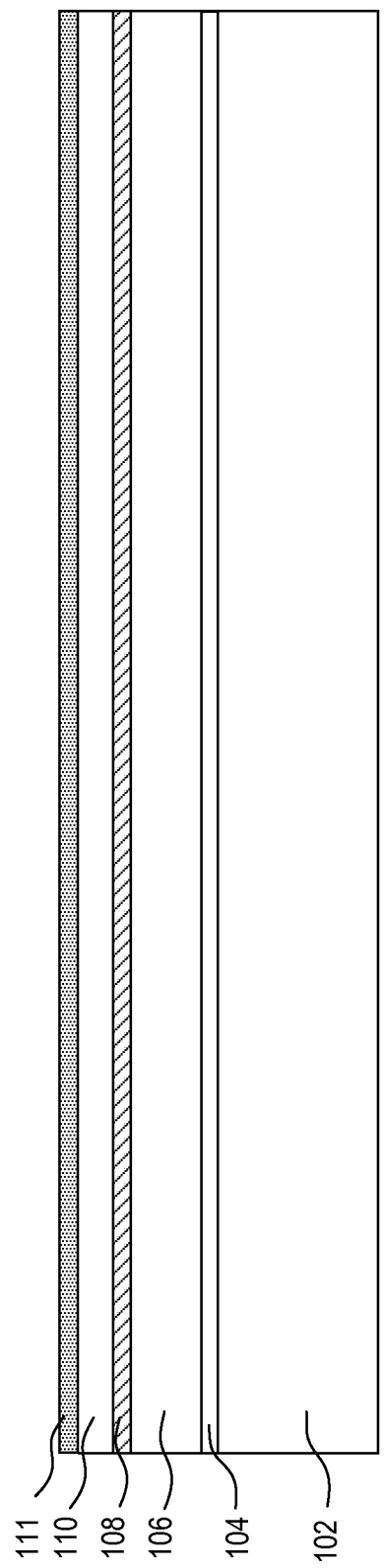
FIG. 2A is a cross-sectional side view illustration of a conductive contact layer on a bulk LED substrate in accordance with an embodiment of the invention.

Referring now to FIG. 2A, a conductive contact layer 111 may then be formed over the p-n diode layer 105 of the bulk LED substrate 100. In an embodiment, the bulk LED substrate 100 illustrated in FIG. 2A is an aluminum gallium indium phosphide (AlGaInP) system on gallium arsenide (GaAs) substrate designed for red, yellow, orange or infrared emission. Conductive contact layer 111 may be formed of a variety of conductive materials including metals, conductive oxides, and conductive polymers. In an embodiment, conductive contact layer 111 is formed using a suitable technique such as evaporation or sputtering. In an embodiment, conductive contact layer 111 is formed of a transparent electrode material. Conductive contact layer 111 may include BeAu metal alloy, or a metal stack of Au/GeAu/Ni/Au layers. Conductive contact layer 111 may also be a transparent conductive oxide (TCO) such as indium-tin-oxide (ITO). Conductive contact layer can also be a combination of one or more metal layers and a conductive oxide. In an embodiment, conductive contact layer 111 is approximately 600 angstroms thick ITO.

Figure 2B:
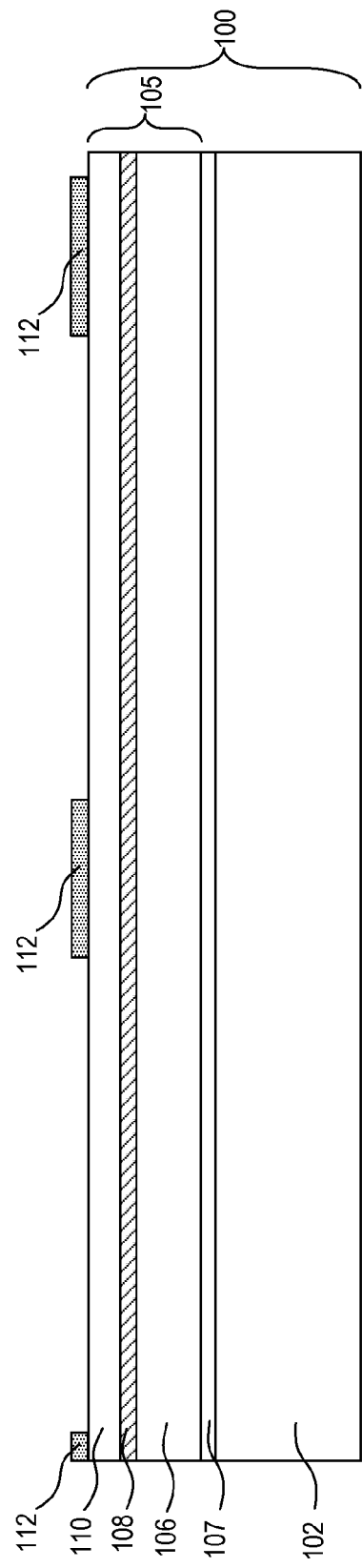
FIG. 2B is a cross-sectional side view illustration of a patterned conductive contact layer on a bulk LED substrate in accordance with an embodiment of the invention.

FIG. 2B is a cross-sectional side view illustration of a conductive contact layer that has been patterned to form an array of electrically conductive contacts 112 on a bulk LED substrate in accordance with an embodiment of the invention. In an embodiment, the bulk LED substrate 100 illustrated in FIG. 2B is designed for blue or green emission. The electrically conductive contacts of FIG. 2B may be formed of the same materials as the conductive contact layer 112 of FIG. 2A. In an embodiment, the electrically conductive contacts 112 of FIG. 2B include a BeAu metal alloy, or a metal stack of Au/GeAu/Ni/Au layers.

Figure 3A:
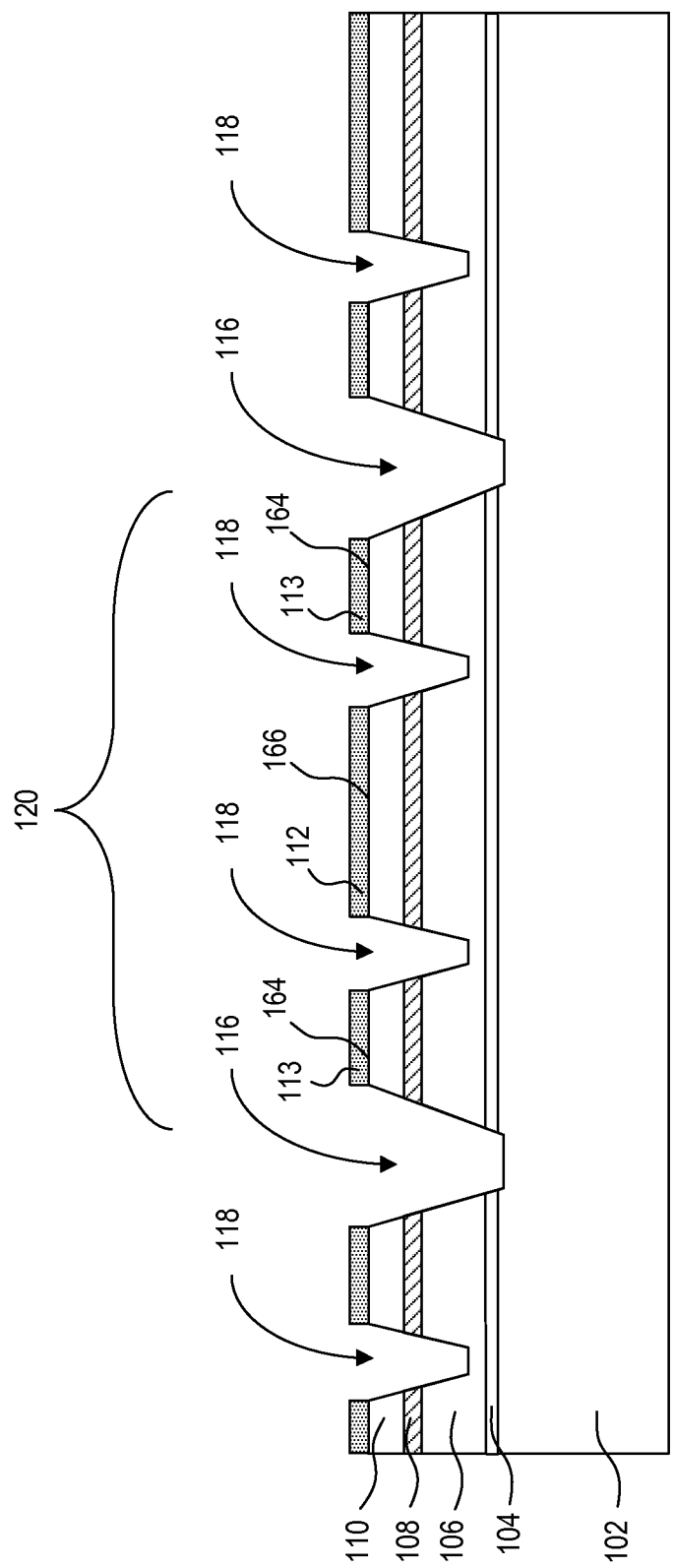
FIG. 3A-3B are cross-sectional side view illustrations of an array of mesa trenches and confinement trenches formed in a p-n diode layer in accordance with embodiments of the invention.
Figure 3B:
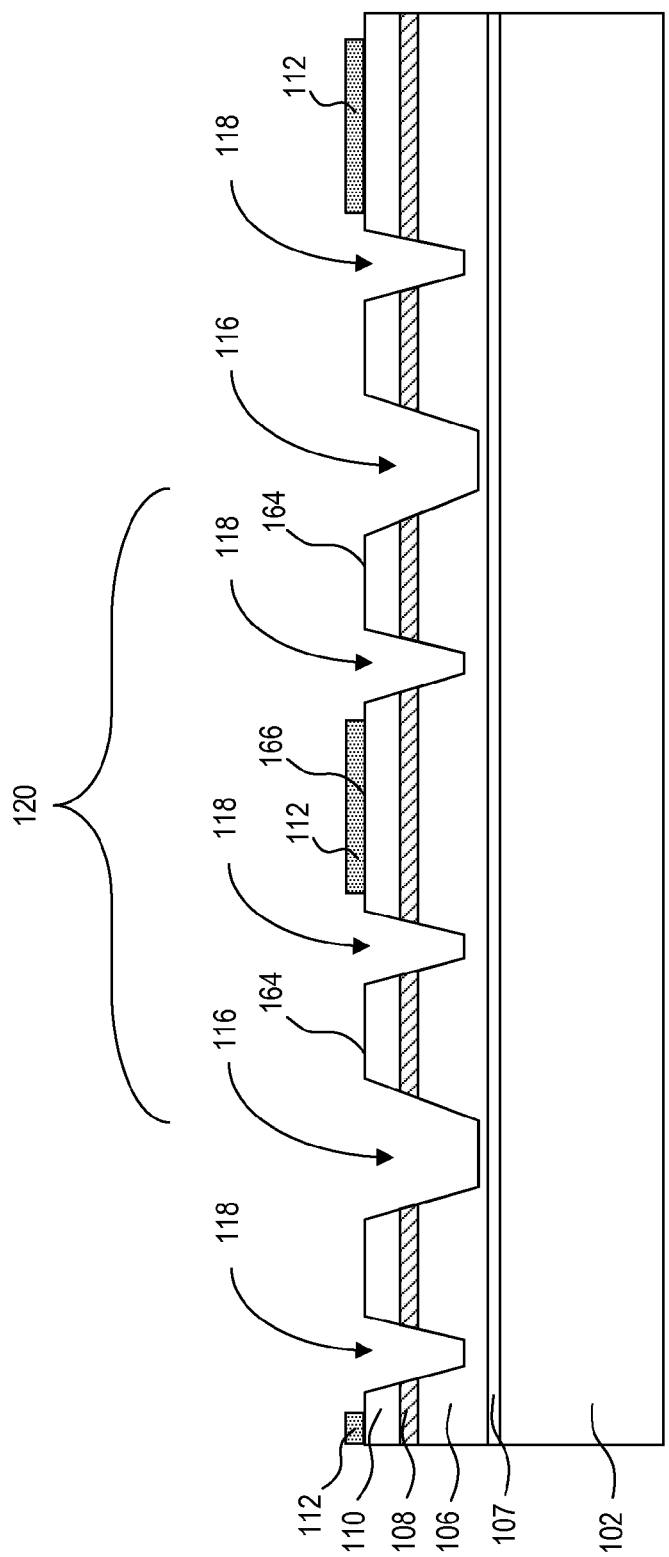

Referring now to FIGS. 3A-3B, the p-n diode layer 105 is patterned to form an array of LED mesa structures 120 separated by an array of mesa trenches 116 over the handle substrate 102. The p-n diode layer 105 is also patterned to include a corresponding array of confinement trenches 118 within the array of LED mesa structures 120. As illustrated, the confinement trenches 118 extend through the quantum well layer(s) 108 in each of the LED mesa structures 120. In an embodiment, confinement trenches 118 extend partially into doped layer 106, but not completely through the p-n diode layer 105 (e.g. not completely through doped layer 106 or an ohmic contact layer, if present). In an embodiment, mesa trenches 116 extend completely through the doped layer 106. In an embodiment illustrated in FIG. 3A, mesa trenches 116 extend through etch stop layer 104. In such an embodiment, mesa trenches 116 may stop on the handle substrate 102 or extend partially into handle substrate 102. In an embodiment illustrated in FIG. 3B, mesa trenches 116 do not extend completely through doped layer 106. In another embodiment, mesa trenches 116 extend partially or completely through buffer layer 107.

As illustrated, each mesa structure 120 includes an interior bottom surface 166 defined by the confinement trench 118, and a surrounding bottom surface 164 between the confinement trench 118 and mesa trench 116. The mesa trenches 116 and confinement trenches 118 illustrated in FIGS. 3A-3B may be formed sequentially, in either order, or simultaneously. In an embodiment, trenches 116, 118 are simultaneously etched with relative depths being controlled by opening size in a mask layer used for etching. Etching may be wet or dry depending upon the desired angles for sidewalls of trenches 116, 118. Conductive contact layer 112 of FIG. 3A may be patterned to form an array of electrically conductive contacts 112 over the array interior bottom surfaces 166 of the p-n diode layer, and an array of electrically conductive traces 113 over the surrounding bottom surfaces 164 of the p-n diode layer. As illustrated the array of electrically conductive contacts 112 are physically and electrically separated from the electrically conductive traces 113. Conductive contact layer 112 of FIG. 3A may be etched with the same or different etching chemistry used to etch the p-n diode layer 105 and etch stop layer 104. In an embodiment, dry etching techniques such as reactive ion etching (RIE), electro-cyclotron resonance (ECR), inductively coupled plasma reactive ion etching (ICP-RIE), and chemically assisted ion-beam etching (CAIBE) may be used. The etching chemistries for FIGS. 3A-3B may be halogen based, containing species such as $Cl_2$, $BCl_3$, or $SiCl_4$. The etching chemistries for FIG. 3A may also be wet chemistries containing species such as $Br_2$ or $HIO_4$. In such an embodiment, a separate wet etching chemistry can be used for etching the conductive contact layer 112. In an embodiment illustrated in FIG. 3A conductive contact layer 112 is dry etched with the mesa structures 120 using a suitable dry etching chemistry such as $Cl_2$, $BCl_3$, or $SiCl_4$.

Referring to FIG. 3A, in an embodiment where etch stop layer 104 is formed of InGaP, the etch stop layer 104 may be removed by wet etching in a solution of $HCl+H_3PO_4$. As illustrated in FIG. 3A, etching of mesa trenches 116 may be continued into the growth substrate 102. For example, a GaAs growth substrate 102 can be etched with a $H_2SO_4+H_2O_2$ solution, $NH_4OH+H_2O_2$ solution, or $CH_3OH+Br_2$ chemistry.

Referring to FIG. 3B, in an embodiment, etching of mesa trenches 116 stops inside the doped layer 106. In an embodiment, where doped layer 106 and buffer layer 107 are formed of the same material, such as GaN, the only difference between the layers may be doping profile. In such an instance, a physical layer boundary is not present.

Figure 4A:
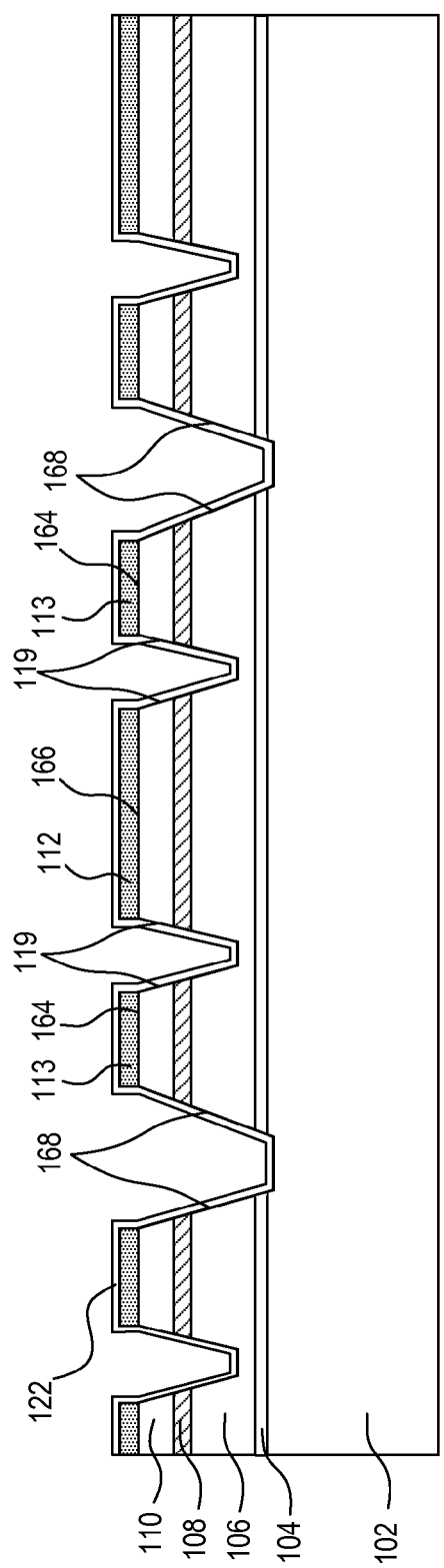
FIGS. 4A-4B are cross-sectional side view illustrations of a passivation layer formed over a an array of mesa structures in accordance with embodiments of the invention.
Figure 4B:
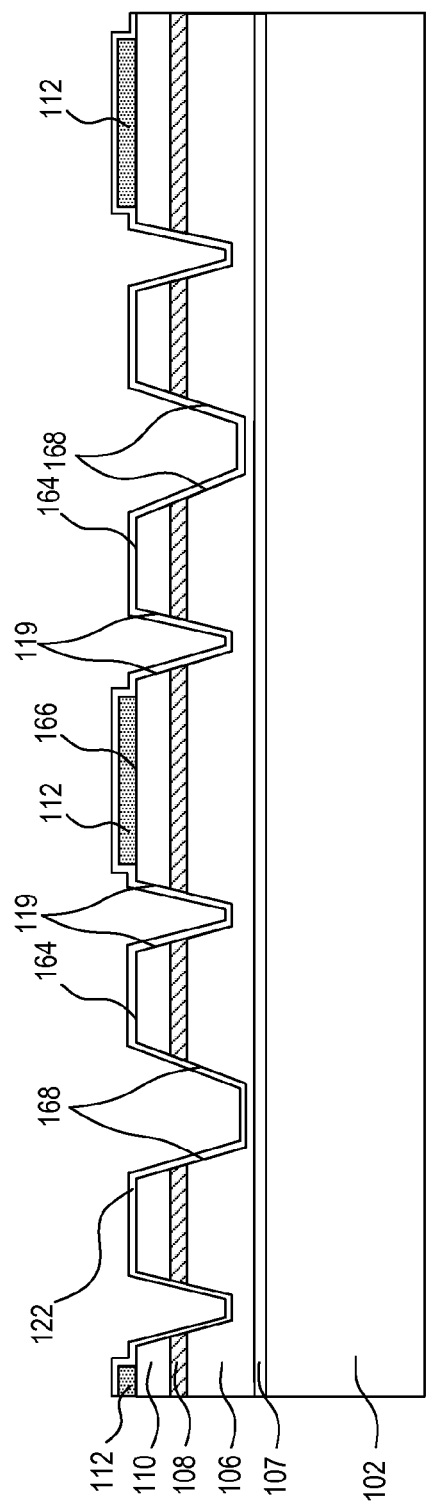

Following the formation of mesa trenches 116 and confinement trenches 118 a passivation layer 122 may be formed over the topography of the resulting structure as illustrated in FIGS. 4A-4B. In the particular embodiments illustrated the passivation layer 122 is conformal to and forms an outline of the topography of the underlying structure. Passivation layer 122 may be formed of any suitable electrical insulator material such an oxide or nitride. In an embodiment, passivation layer is approximately 50 angstroms to 3,000 angstroms thick $Al_2O_3$. In an embodiment, passivation layer 122 is formed using a high quality thin film deposition procedure, such as atomic layer deposition (ALD). As will become more apparent in the following description, a high quality thin film deposition procedure may protect the integrity of the passivation layer 122 during the sacrificial release layer etch operation. Following deposition of the passivation layer 122, in an embodiment, the substrate assembly is annealed in order to make ohmic contact with the array of electrically conductive contacts 112 and the array of mesa structures 120. In an embodiment, annealing after formation of the trenches 116, 118 aids in healing damage on the sidewalls 168, 119 of the p-n diode layer 105 that resulted from the formation of trenches 116, 118. It is anticipated that performing the anneal operation after formation of trenches 116, 118 may increase efficiency of the resultant LED device.

Still referring to FIGS. 4A-4B, the electrically conductive contacts 112 on the interior bottom surfaces 166 of the p-n diode layer are in electrical contact with the interior bottom surfaces 166 and are not in electrical contact with the surrounding bottom surfaces 164 of the p-n diode layer.

Figure 5A:
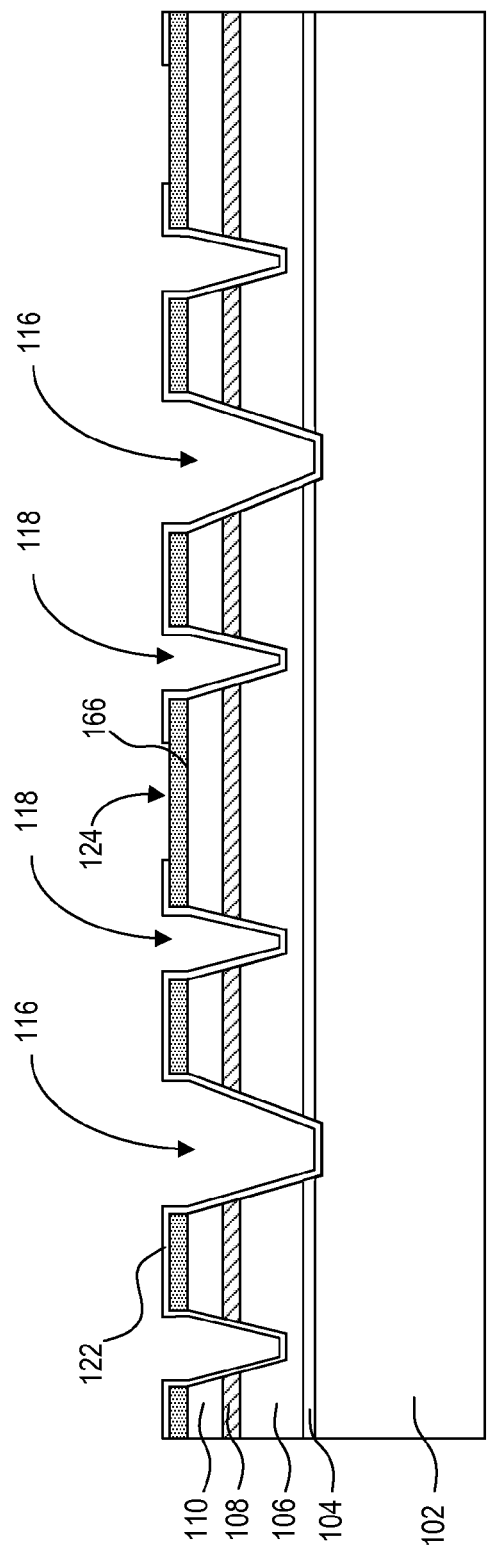
FIGS. 5A-5B is a cross-sectional side view illustrations of contact openings formed in a passivation layer over an array of mesa structures in accordance with an embodiment of the invention.
Figure 5B:
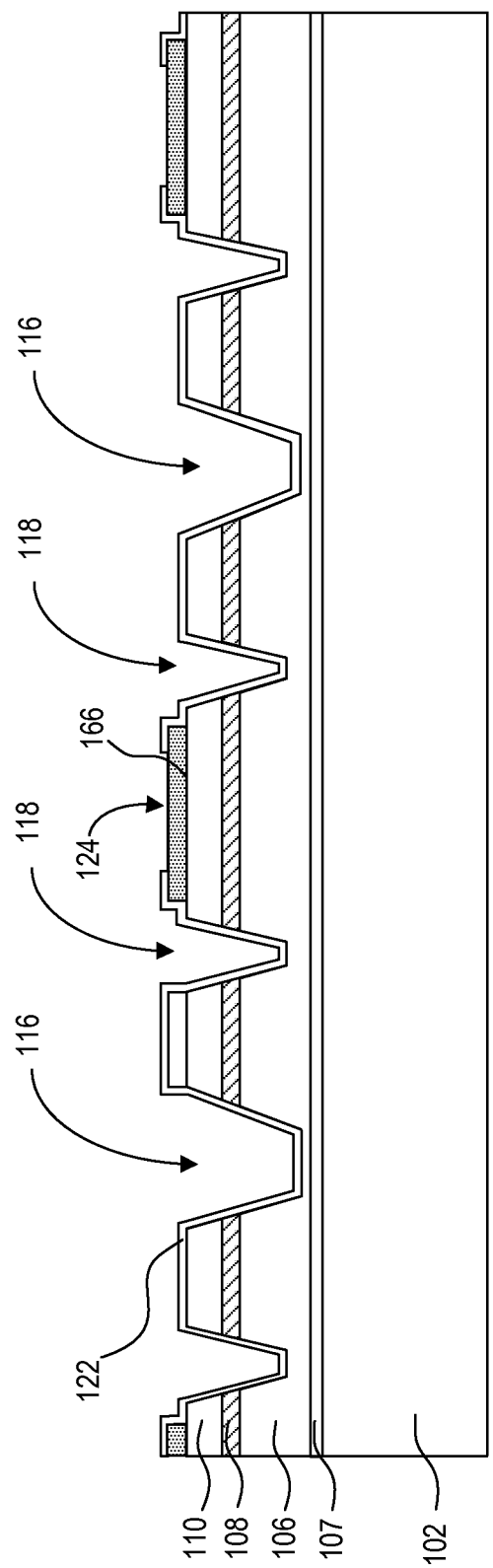

Referring now to FIGS. 5A-5B, contact openings 124 may be formed in the passivation layer 122 over the interior bottom surfaces 166 of the mesa structures 120 defined by the confinement trenches 118. In an embodiment, an area of contact openings 124 is less than an area of the electrically conductive contact 112 on the interior bottom surfaces 166 of the mesa structures 120 defined by the confinement trenches 118. In this manner, the passivation layer 122 and contact openings 124 can be used to at least partly define the current injection area within the LED device. In an embodiment, openings 124 are formed using photolithography and a buffered oxide etch (BOE) chemistry such as a dilute hydrofluoric acid (HF).

In interests of clarity and conciseness, the following description with regard to FIGS. 6-14 is made with regard to the structure of FIG. 5A. Separate description and illustration is not provided with regard to the structure of FIG. 5B, though it is to be appreciated that similar processing sequences are contemplated.

Figure 6:
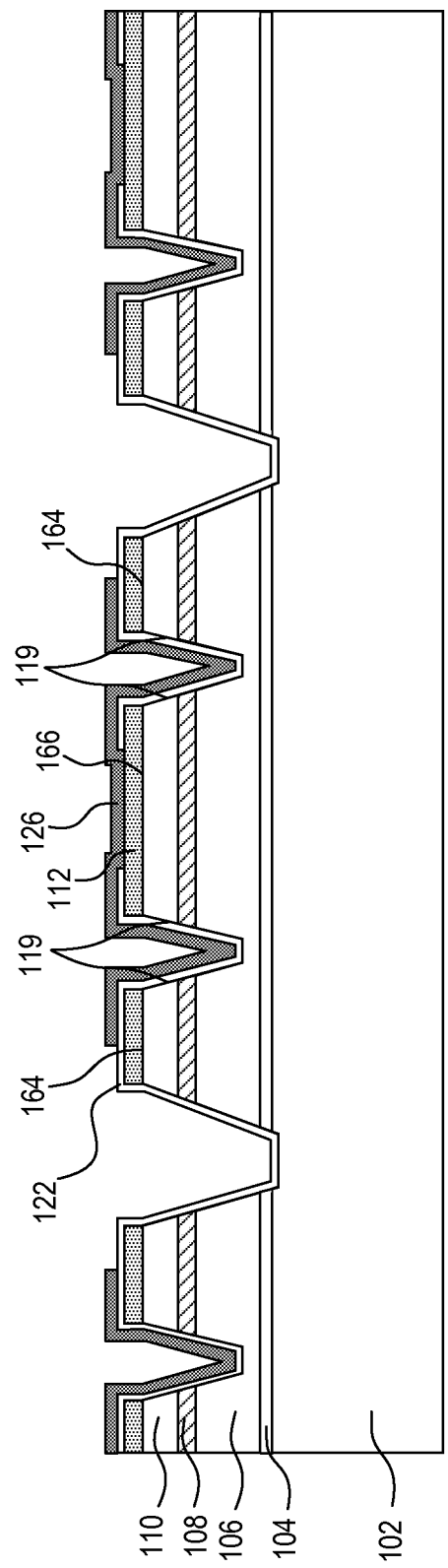
FIG. 6 is a cross-sectional side view illustration of a patterned mirror layer formed over an array of mesa structures in accordance with an embodiment of the invention.

Referring now to FIG. 6, in an embodiment a patterned mirror layer 126 is then formed on the array of mesa structures 120. In the particular embodiment illustrated, a patterned mirror layer 126 spans along the bottom surface of the p-n diode layer and along the confinement trench sidewalls 119 within the confinement trench 118. For example, the patterned mirror layer 126 may be formed within the contact openings 124 in the passivation layer 122 in order to make electrical contact with the electrically conductive contacts 112 on the interior bottom surfaces 166 of the mesa structures 120 defined by the confinement trenches 118. The passivation layer 122 may prevent the patterned mirror layer 126 from making electrical contact with the surrounding bottom surfaces 164 of the mesa structures 120. In the particular embodiment illustrated, the patterned mirror layer 126 does not span along the external sidewalls 168 of the p-n diode layer defined by the mesa trenches 116. This may aid in forming laterally separate LED devices in the following processing sequence. This may also be beneficial for an electrostatic transfer operation, where a conductor located along external sidewalls of the LED devices could potentially short an electrostatic transfer head, resulting in the LED device not being picked up.

The patterned mirror layer 126 may be formed from a variety of different materials based upon the emission spectra characteristics of the p-n diode layer 105, and formed using different methods. For example, the patterned mirror layer 126 may be formed by blanket deposition followed by lithography and etching, or the patterned mirror layer 126 may be formed using a photoresist lift-off technique. In an embodiment, where the p-n diode layer 105 is designed for red color emission, the patterned mirror layer 126 may be formed of gold, for example with a thickness of 500 angstroms to 0.5 µm. Gold may reflect greater than 90% of the red wavelength spectrum. Furthermore, gold may be a suitable bonding material for the stabilization layer 132 that is yet to be formed. In applications where the p-n diode layer 105 is designed for green or blue emission, then the patterned mirror layer 126 may include one or more layers. In an embodiment, aluminum or silver is used to reflect the green or blue emission spectra. In an embodiment, the patterned mirror layer 126 additionally includes a bonding layer such as gold to control the bonding strength with the stabilization layer 132 that is yet to be formed. For example, a patterned mirror layer 126 may include a first reflective layer such as aluminum or silver for blue or green wavelength reflection, for example with a thickness of 500 angstroms to 0.5 µm, followed by a barrier layer such as Ti, Pt, TiW with a thickness of 50 angstroms to 200 angstroms, and a 500 angstroms to 0.5 µm thick bonding layer such as gold deposited on the barrier layer to control adhesion strength with the stabilization layer 132.

Figure 7:
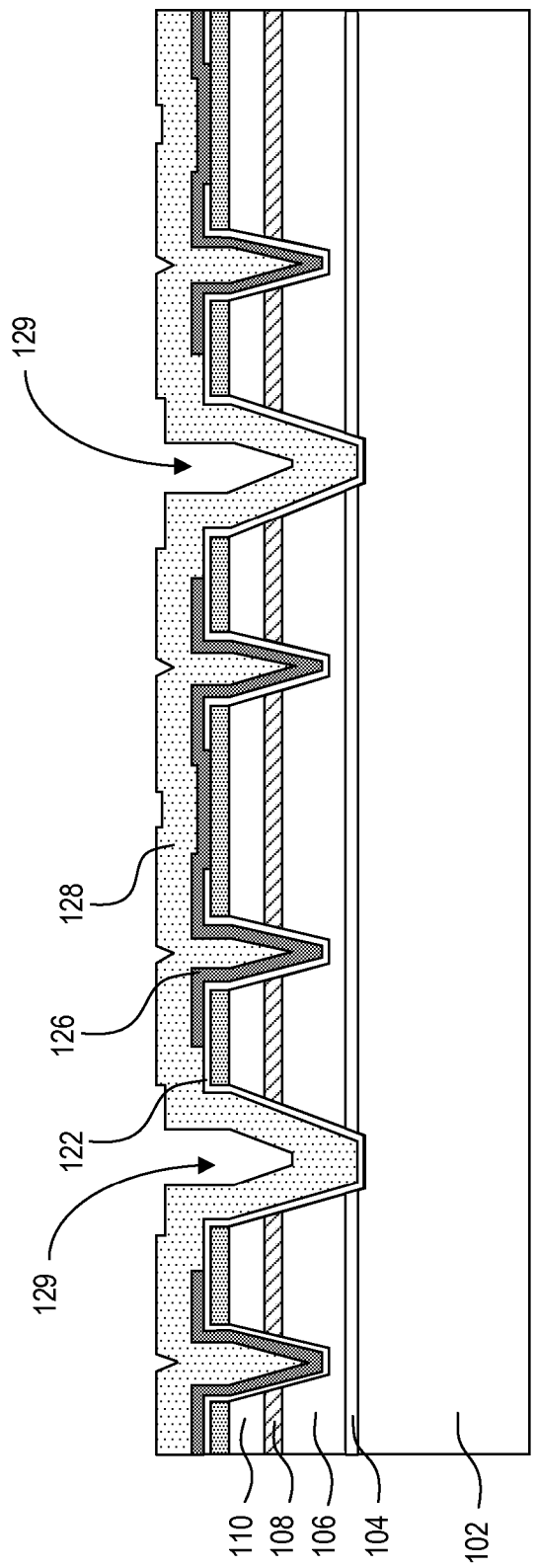
FIG. 7 is a cross-sectional side view illustration of a sacrificial release layer formed over an array of mesa structures in accordance with an embodiment of the invention.

A sacrificial release layer 128 may then be formed over the array of mesa structures 120 as illustrated in FIG. 7. In the particular embodiment illustrated, the sacrificial release layer 128 is formed within both the mesa trenches 116 and confinement trenches 118. As will become more apparent in the following description, the thickness of the passivation layer 122, mirror layer 126, and sacrificial release layer 128 may all contribute to the dimensions of the openings 129, which will become the staging cavity sidewalls 136 following the formation of the stabilization layer. In an embodiment, the sacrificial release layer 128 is not used to make electrical contact with the array of LED devices and is formed of an electrically insulating material. In an embodiment, the sacrificial release layer 128 is formed of a material which can be readily and selectively removed with vapor (e.g. vapor HF) or plasma etching. In an embodiment, the sacrificial release layer is formed of an oxide (e.g. $SiO_2$) or nitride (e.g. $SiN_x$), with a thickness of 0.2 µm to 2 µm. In an embodiment, the sacrificial release layer is formed using a comparatively low quality film formation technique compared to the passivation layer 122. In an embodiment, the sacrificial release layer 128 formed by sputtering, low temperature plasma enhanced chemical deposition (PECVD), or electron beam evaporation.

Figure 8:
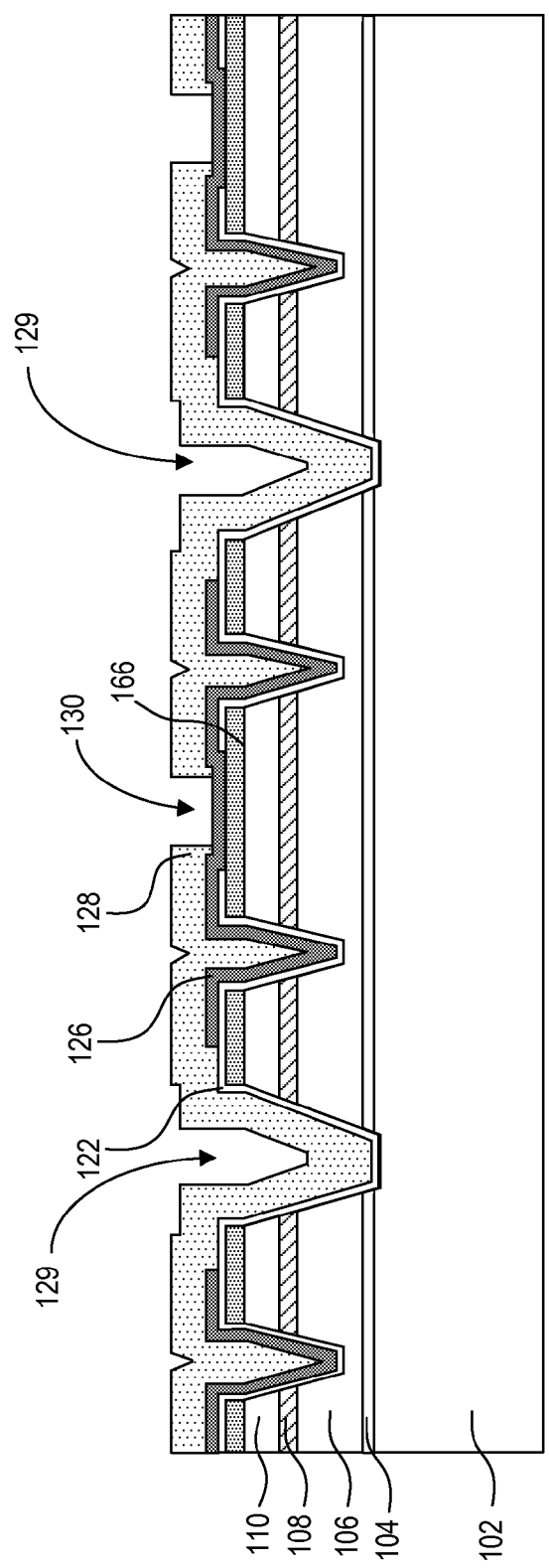
FIG. 8 is a cross-sectional side view illustration an array of openings formed in a sacrificial release layer over an array of mesa structures in accordance with an embodiment of the invention.

Referring now to FIG. 8, the sacrificial release layer 128 is patterned to from an array of openings 130 over the array of mesa structures 120. In the particular embodiment illustrated, the array of openings 130 are formed over the interior bottom surfaces 166 of the mesa structures 120 defined by the confinement trenches 118. In an embodiment, each opening 130 exposes an underlying mirror layer 126. As will become more apparent in the following description, the dimensions of the openings 130 in the sacrificial release layer 128 correspond to the dimensions and contact area of the stabilization posts to be formed, and resultantly to the adhesion strength that must be overcome to pick up the array of LED devices that is supported by and poised for pick from the array of stabilization posts. In an embodiment, openings 130 are formed using lithographic techniques and have a length and width of approximately 1 µm by 1 µm, though the openings may be larger or smaller. In an embodiment, openings 130 have a width (or area) that is less than the width (or area) of the interior bottom surfaces 166 of the mesa structures 120 defined by the confinement trenches 118. In an embodiment, one or more openings 130 are formed within the confinement trenches 118. In this manner, the stabilization posts to be formed will be embedded within the LED devices, further stabilizing the LED devices on the carrier substrate.

Figure 9B:
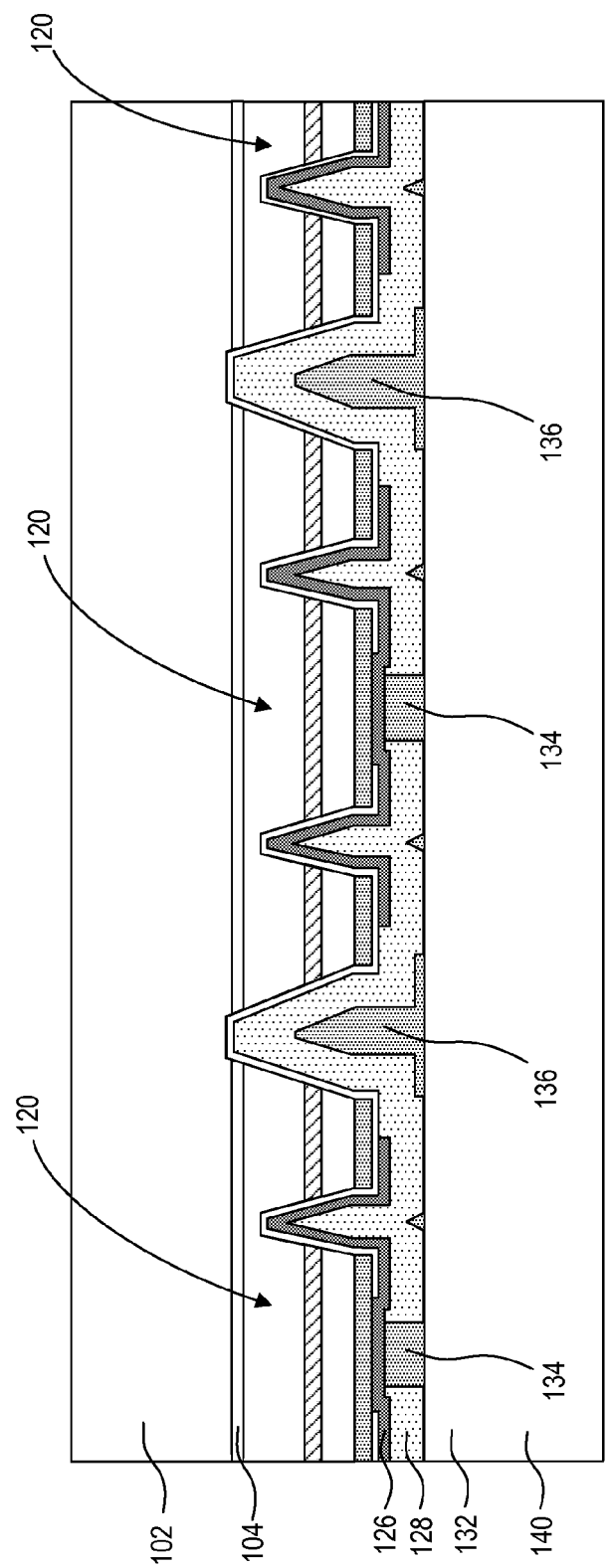

Referring now to FIGS. 9A-9B, in an embodiment a stabilization layer 132 is formed over the patterned sacrificial release layer 128 and bonded to a carrier substrate 140. In accordance with embodiments of the invention, stabilization layer 132 may be formed of an adhesive bonding material. In an embodiment the adhesive bonding material is a thermosetting material such as benzocyclobutene (BCB) or epoxy. For example, the thermosetting material may be associated with 10% or less volume shrinkage during curing, or more particularly about 6% or less volume shrinkage during curing so as to not delaminate from the mirror layer 126 on the LED devices to be formed. In order to increase adhesion the underlying structure can be treated with an adhesion promoter such as AP3000, available from The Dow Chemical Company, in the case of a BCB stabilization layer in order to condition the underlying structure. AP3000, for example, can be spin coated onto the underlying structure, and soft-baked (e.g. 100° C.) or spun dry to remove the solvents prior to applying the stabilization layer 132 over the patterned sacrificial release layer 128.

In an embodiment, stabilization layer 132 is spin coated or spray coated over the patterned sacrificial release layer 128, though other application techniques may be used. Following application of the stabilization layer 132, the stabilization layer may be pre-baked to remove the solvents. After pre-baking the stabilization layer 132 the patterned bulk substrate 100 is bonded to the carrier substrate 140 with the stabilization layer 132. In an embodiment, bonding includes curing the stabilization layer 132. Where the stabilization layer 132 is formed of BCB, curing temperatures should not exceed approximately 350° C., which represents the temperature at which BCB begins to degrade. Achieving a 100% full cure of the stabilization layer may not be required in accordance with embodiments of the invention. In an embodiment, stabilization layer 132 is cured to a sufficient curing percentage (e.g. 70% or greater for BCB) at which point the stabilization layer 132 will no longer reflow. Moreover, it has been observed that partially cured BCB may possess sufficient adhesion strengths with carrier substrate 140 and the patterned sacrificial release layer 128. In an embodiment, stabilization layer may be sufficiently cured to sufficiently resist the sacrificial release layer release operation.

In an embodiment, the stabilization layer 132 is thicker than the height of openings 130 in the patterned sacrificial release layer 128. In this manner, the thickness of the stabilization layer filling openings 130 will become stabilization posts 134, and the remainder of the thickness of the stabilization layer 132 over the filled openings 130 can function to adhesively bond the patterned bulk LED substrate 100 a carrier substrate 140. In an embodiment, a portion of the stabilization layer 132 flows into the openings 129 to form staging cavity sidewalls 136. In an embodiment illustrated in FIG. 9A, after bonding to the carrier substrate 140, the stabilization layer is thicker than the stabilization posts 134. For example, a continuous portion of stabilization layer 132 remains over the carrier substrate 140. In an embodiment illustrated in FIG. 9B, the sacrificial release layer 128 (or another intermediate layer) is pressed against the carrier substrate 140 during bonding such that there is not a thickness of the stabilization layer 132 below the stabilization posts 134. In such an embodiment, the openings 129 can function as overflow cavities for the stabilization layer during bonding. In an embodiment, the openings 129 are not completely filled with stabilization layer, which becomes the staging cavity sidewalls 136.

Figure 10:
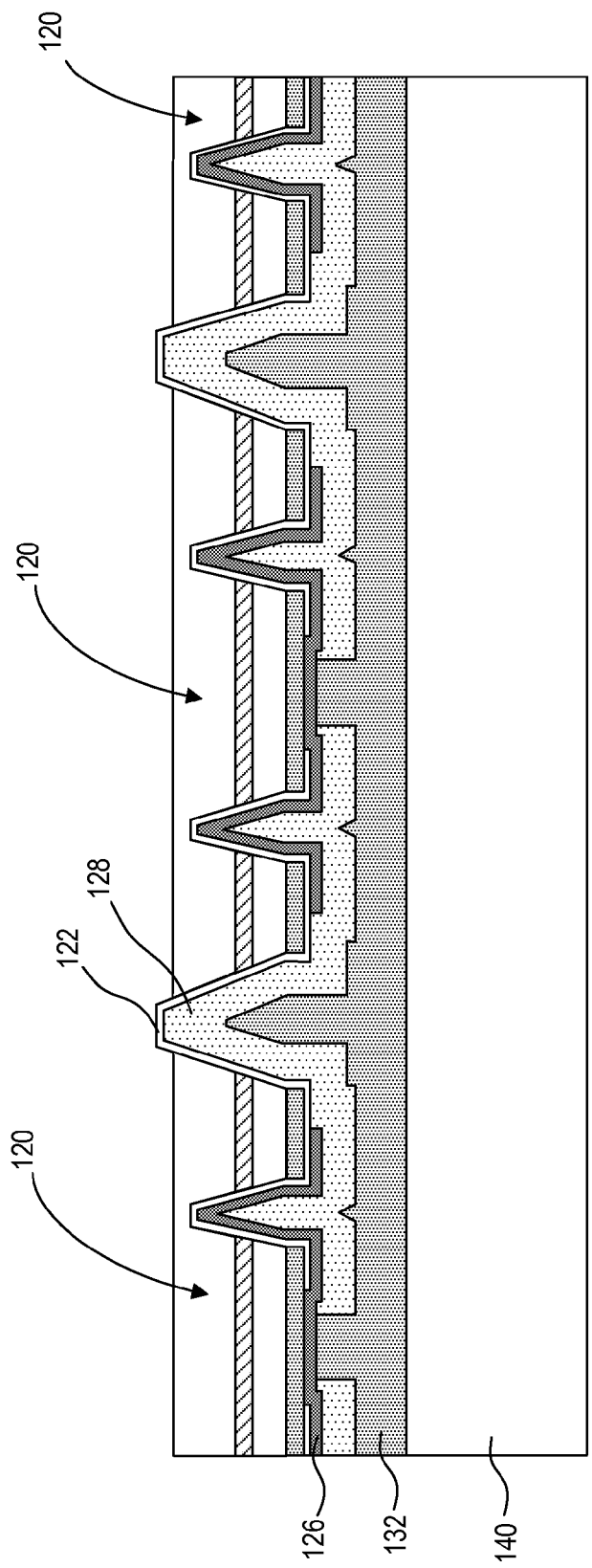
FIG. 10 is a cross-sectional side view illustration of an array of mesa structures on a carrier substrate after removal of a handle substrate in accordance with an embodiment of the invention.

Following bonding of the patterned bulk LED substrate 100 to the carrier substrate 140, the handle 102 substrate and optional etch stop layer 104 or buffer layer 107 are removed as illustrated in FIG. 10. Removal of handle substrate 102 may be accomplished by a variety of methods including laser lift off (LLO), grinding, and etching depending upon the material selection of the growth substrate 102. Upon removal of the handle substrate 102 and layers 104 or 107 portions of the passivation layer 122 or sacrificial release layer 128 may protrude above an exposed top surface of the p-n diode layer 105 of the mesa structures 120.

In the particular embodiment illustrated where handle substrate 102 is a growth substrate formed of GaAs, removal may be accomplished by etching, or a combination of grinding and selective etching, with the selective etching stopping on an etch stop layer 104. For example, the GaAs growth substrate 102 can be removed with a $H_2SO_4+H_2O_2$ solution, $NH_4OH+H_2O_2$ solution, or $CH_3OH+Br_2$ chemistry, stopping on etch stop layer 104 formed of InGaP, for example. The etch stop layer 104 may then be removed to expose the p-n diode layer 105. In an embodiment where etch stop layer is formed of InGaP, the etch stop layer may be removed by wet etching in a solution of $HCl+H_3PO_4$.

In an embodiment where the handle substrate 102 is a growth substrate formed of sapphire, removal may be accomplished using LLO in which a 102/107 interface is irradiated with an ultraviolet laser such as a Nd-YAG laser or KrF excimer laser. Absorption in the GaN buffer layer 107 at the interface with the transparent growth substrate 102 results in localized heating of the interface resulting in decomposition at the interfacial GaN to liquid Ga metal and nitrogen gas. Once the desired area has been irradiated, the transparent sapphire growth substrate 102 can be removed by remelting the Ga on a hotplate. Following removal of the growth substrate, the GaN buffer layer 107 can be removed resulting a desired thickness for doped layer 106. Removal of buffer layer 107 can be performed using any of the suitable dry etching techniques described above with regard to forming trenches 116, 118, as well as with CMP or a combination of both.

Figure 11:
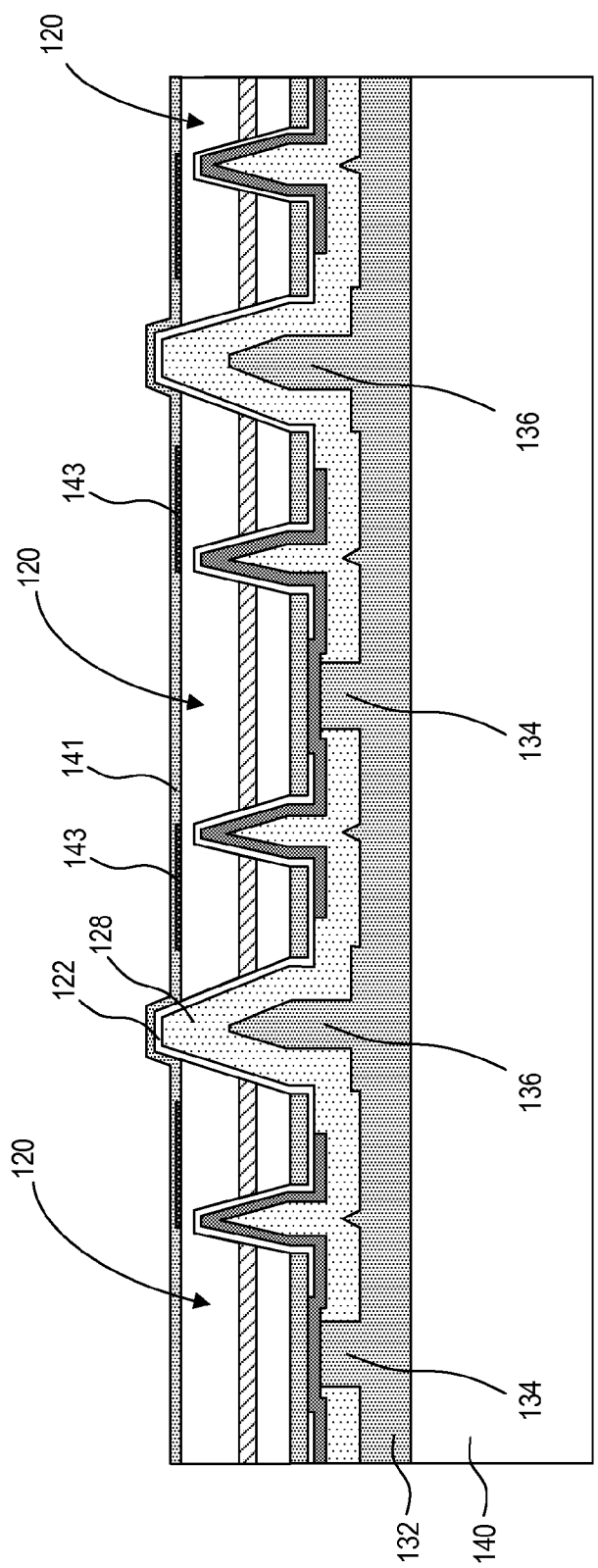
FIG. 11 is a cross-sectional side view illustration of a top conductive contact layer formed over an array of mesa structures on a carrier substrate in accordance with an embodiment of the invention.

Referring now to FIG. 11, following the removal of the growth substrate 102 a top conductive contact layer 141 may be formed. Top conductive contact layer 141 may be formed of a variety of electrically conductive materials including metals, conductive oxides, and conductive polymers. In an embodiment, conductive contact layer 141 is formed using a suitable technique such as evaporation or sputtering. In an embodiment, conductive contact layer 141 is formed of a transparent electrode material. Conductive contact layer 141 may include BeAu metal alloy, or a metal stack of Au/GeAu/Ni/Au layers. Conductive contact layer 141 may also be a transparent conductive oxide (TCO) such as indium-tin-oxide (ITO). Conductive contact layer 141 can also be a combination of one or more metal layers and a conductive oxide. In an embodiment, conductive contact layer 141 is approximately 600 angstroms thick ITO. In an embodiment, after forming the conductive contact layer 141, the substrate stack is annealed to generate an ohmic contact between the conductive contact layer and the array of mesa structures 120. Where the stabilization layer 132 is formed of BCB, the annealing temperature may be below approximately 350° C., at which point BCB degrades. In an embodiment, annealing is performed between 200° C. and 350° C., or more particularly at approximately 320° C. for approximately 10 minutes.

In an embodiment, prior to forming the top conductive contact layer 141 an ohmic contact layer 143 can optionally be formed to make ohmic contact with the LED mesa structures 120. In an embodiment, ohmic contact layer 143 may be a metallic layer. In an embodiment, ohmic contact layer 143 is a thin GeAu layer for a GaAs or AlGaInP system. In an embodiment, ohmic contact layer 143 is a thin NiAu or NiAl layer for a GaN system. For example, the ohmic contact layer 143 may be 50 angstroms thick. In the particular embodiment illustrated, the ohmic contact layer 143 is not formed over the interior portion 152 (see FIGS. 16A-16B) of the quantum well layer 108 so as to not reflect light back into the LED device and potentially reduce light emission. In some embodiments, ohmic contact layer 143 forms a ring around the interior portion 152 of the quantum well layer 108. For example, ohmic contact layer 143 may be formed over the confinement trench 118 and surrounding portion 154 of the quantum well layer 108.

Figure 12:
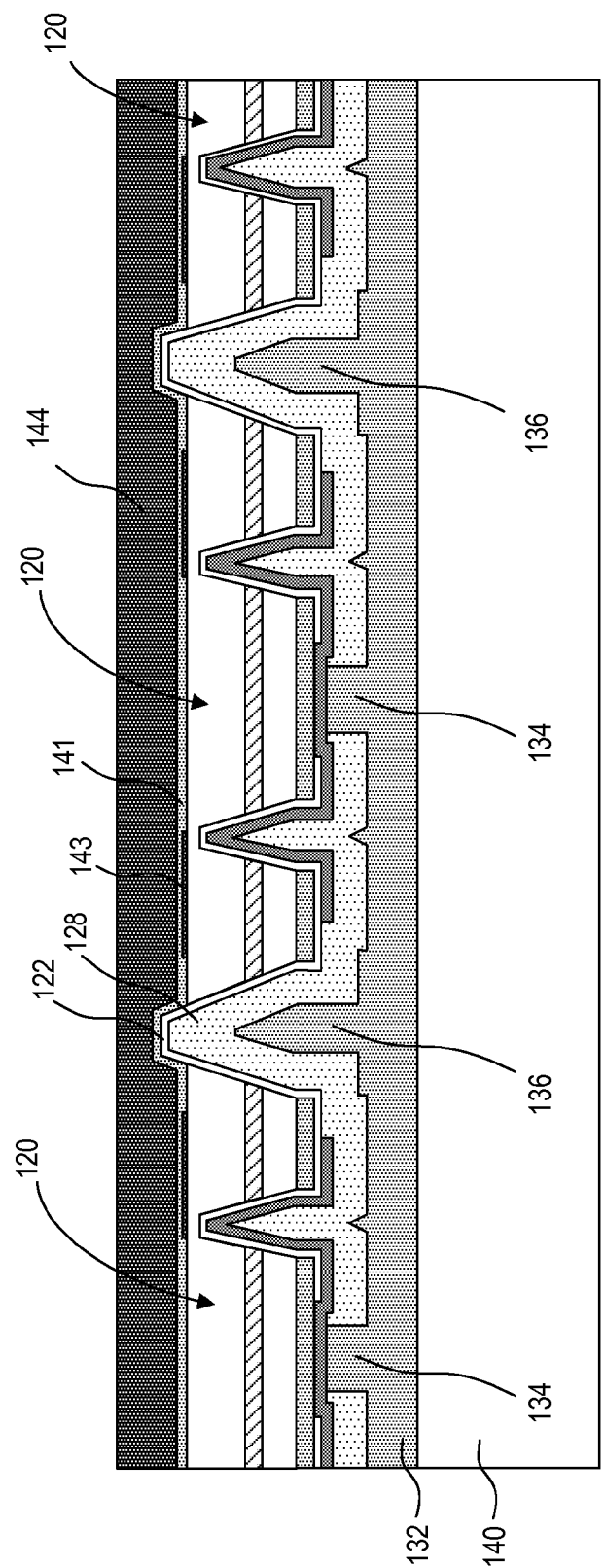
FIG. 12 is a cross-sectional side view illustration of a patterning layer formed over a top conductive contact layer formed over an array of mesa structures on a carrier substrate in accordance with an embodiment of the invention.
Figure 13:
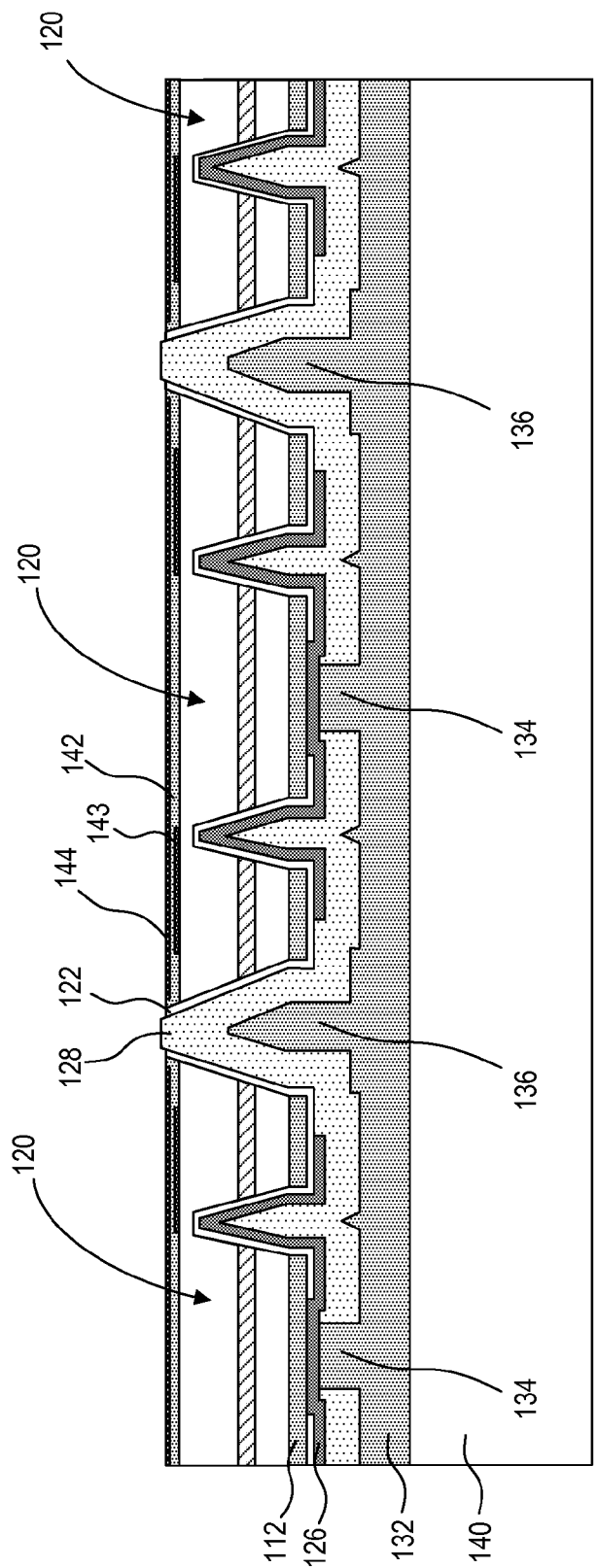
FIG. 13 is a cross-sectional side view illustration of a partially removed conductive contact layer and passivation layer at filled mesa trench locations in accordance with an embodiment of the invention.
Figure 14:
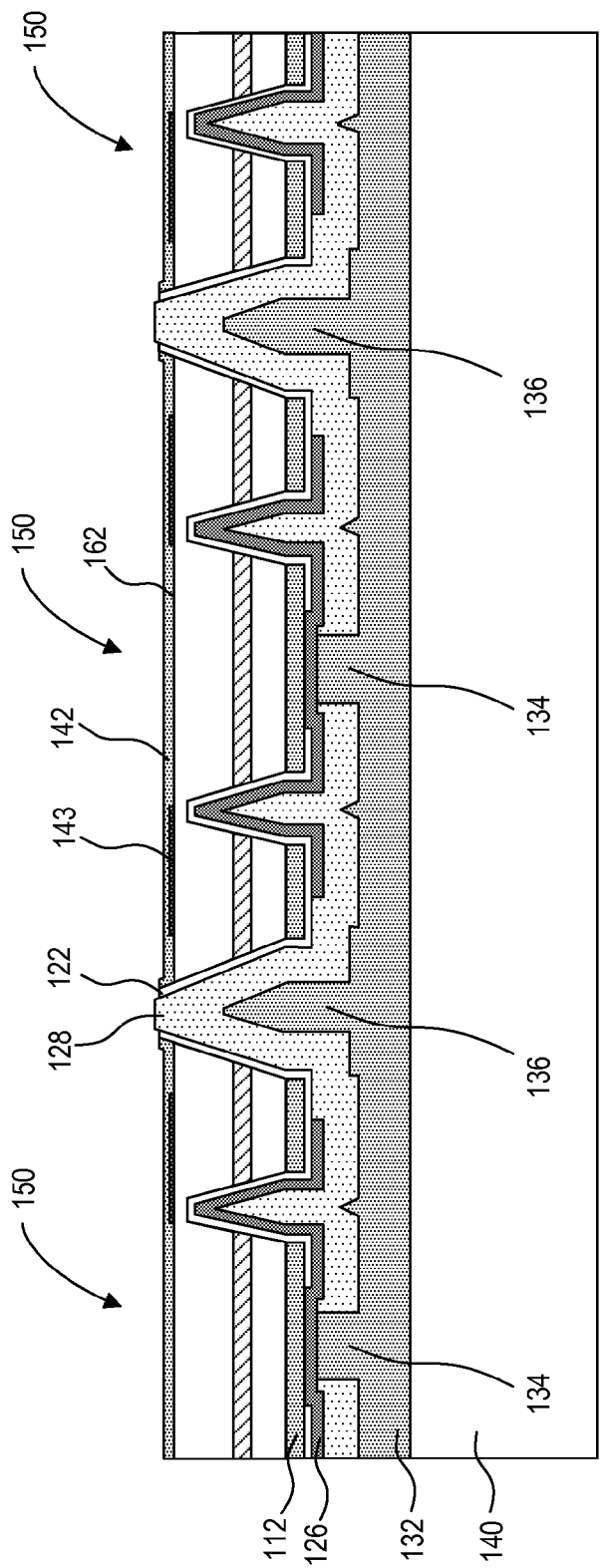
FIG. 14 is a cross-sectional side view illustration of an array of LED devices embedded in a sacrificial release layer after removal of a patterning layer in accordance with an embodiment of the invention.

Referring now to FIG. 12, in an embodiment a patterning layer such as a photoresist is applied over the top conductive contact layer 141. In an embodiment, a photoresist layer 144 is spun on such that it a top surface of the photoresist layer 144 fully covers raised portions of conductive contact layer 141 and passivation layer 122 at the filled mesa trench 116 locations. Referring now to FIG. 13, in an embodiment, the photoresist layer 144 is stripped using a suitable wet solvent or plasma ashing technique until the conductive contact layer 141 and passivation layer 122 are removed over the filled mesa trench 116 locations, exposing the sacrificial release layer 128 between the mesa structures 12, resulting in the formation of an array of top conductive contacts 142. The remaining photoresist layer 144 may then be fully stripped as illustrated in FIG. 14, resulting in an array of laterally separate LED devices 150 supported by an array of stabilization posts 134 and embedded in a sacrificial release layer 128. At this point, the resultant structure still robust for handling and cleaning operations to prepare the substrate for subsequent sacrificial release layer removal and electrostatic pick up.

Still referring to FIG. 14, the top conductive contacts 142 on each LED device 150 are substantially planar and cover substantially the entire top surface 162 of each LED device 150. In such a configuration, the top conductive contacts 142 cover substantially the maximum available surface area to provide a large, planar surface for contact with the electrostatic transfer head, as described in more detail in FIGS. 17A-17E. This may allow for some alignment tolerance of the electrostatic transfer head assembly.

Figure 15A:
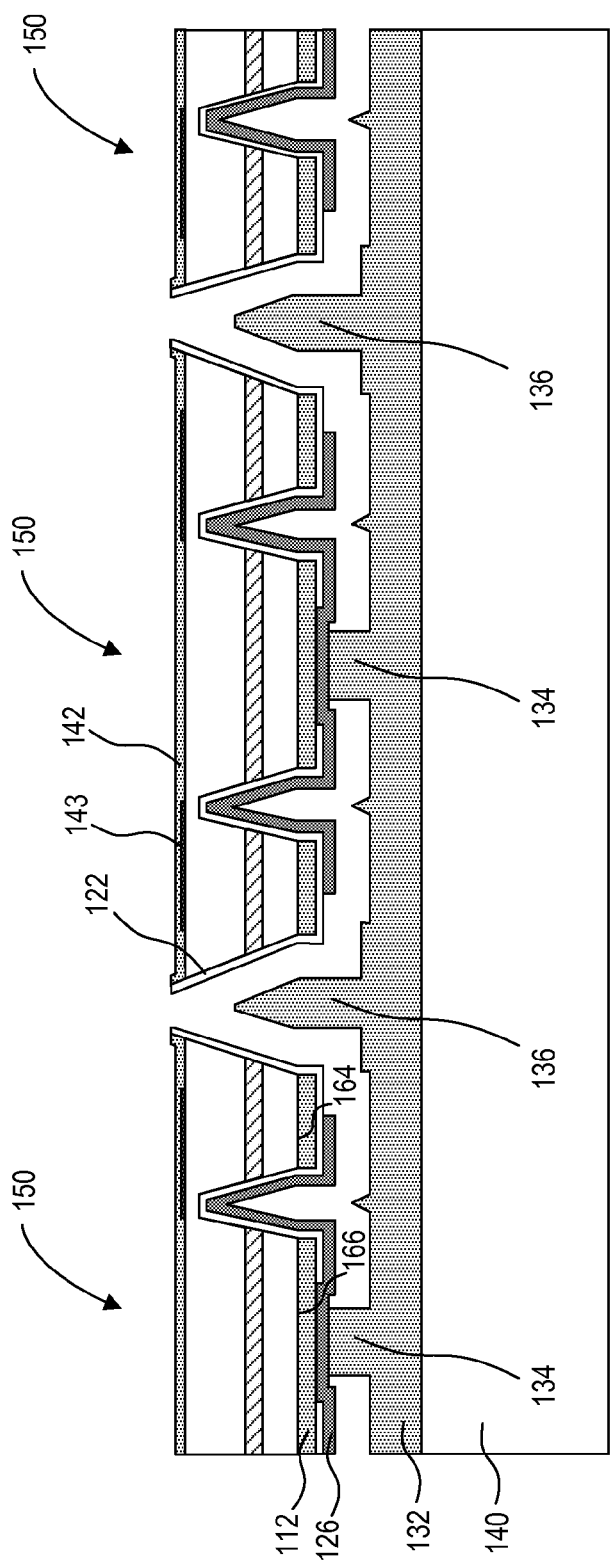
FIGS. 15A-15B are cross-sectional side view illustrations of an array of LED devices supported by an array of stabilization posts after the removal of a sacrificial release layer in accordance with embodiments of the invention.
Figure 15B:
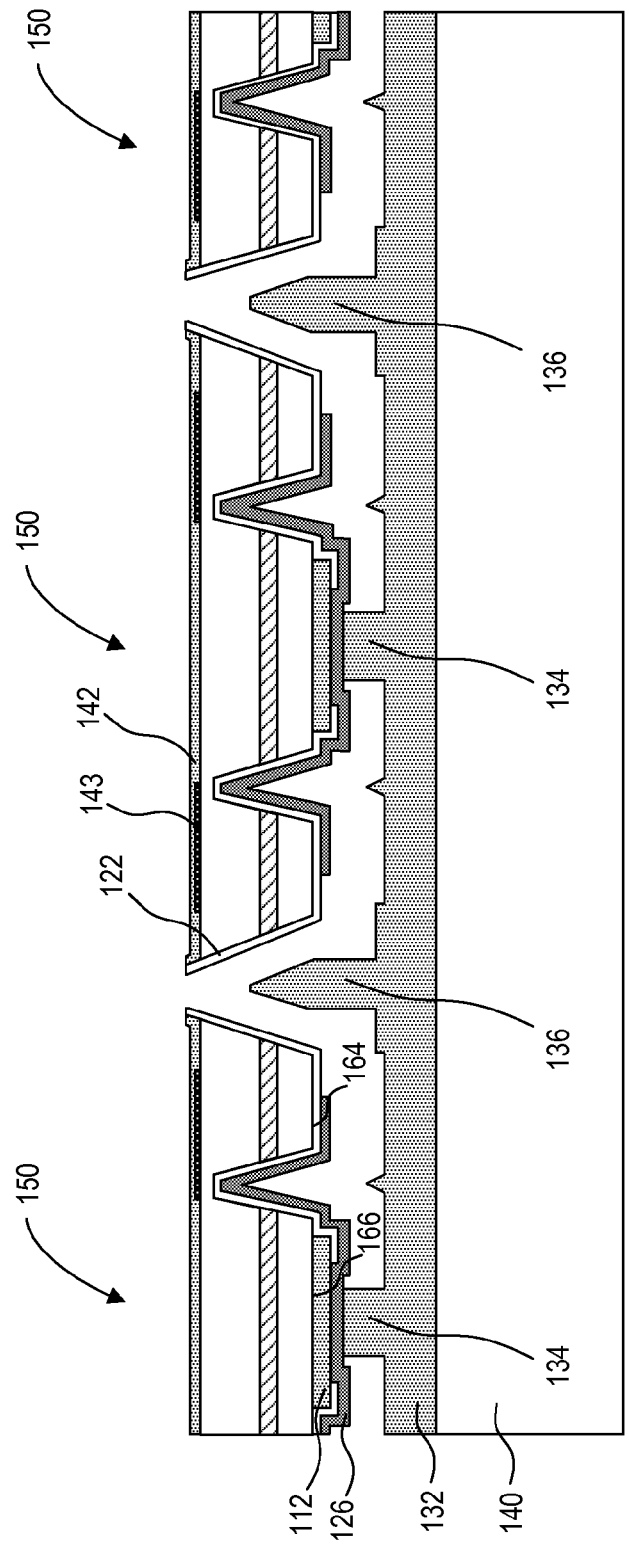

Following the formation of discrete and laterally separate LED devices 150, the sacrificial release layer 128 may be removed. FIGS. 15A-15B are cross-sectional side view illustrations of an array of LED devices 150 supported by an array of stabilization posts 134 after removal of the sacrificial release layer in accordance with embodiments of the invention. In the embodiments illustrated, sacrificial release layer 128 is completely removed resulting in an open space below each LED device 150. A suitable etching chemistry such as HF vapor, or $CF_4$ or $SF_6$ plasma may used to etch the $SiO_2$ or $SiN_x$ sacrificial release layer 128. In an embodiment, the array of LED devices 150 is on the array of stabilization posts 134, and supported only by the array of stabilization posts 134. In an embodiment, staging cavity sidewalls 136 may further aid in keeping the array of LED devices 150 in place should an adhesive bond be broken between any of the LED devices 150 and stabilization posts 134.

In the embodiments illustrated in FIGS. 15A-15B, passivation layer 122 is not removed during removal of the sacrificial release layer 128. In an embodiment, passivation layer 122 is formed of $Al_2O_3$, and a $SiO_2$ or $SiN_x$ sacrificial release layer 128 is selectively removed with vapor HF.

Figure 16A:
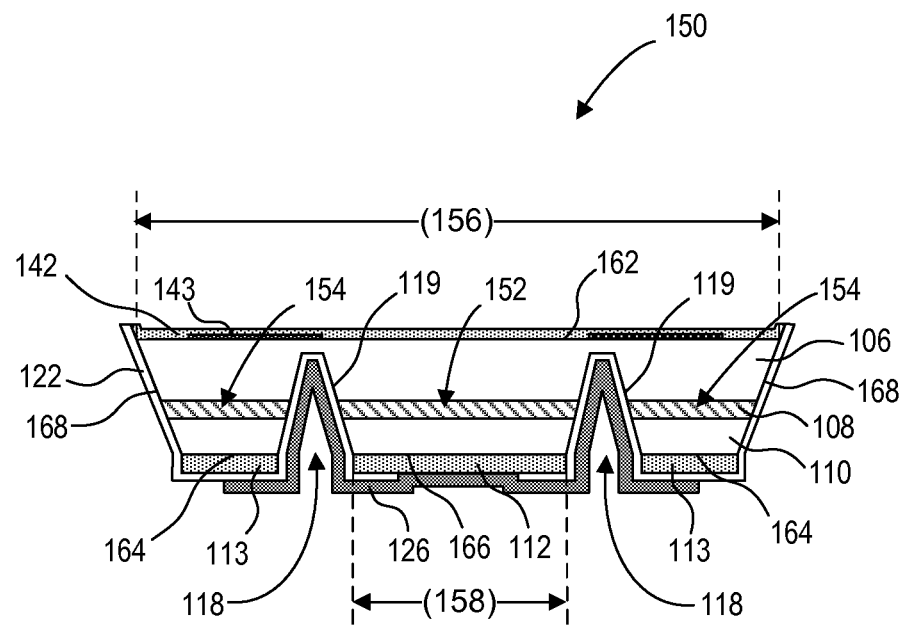
FIG. 16A is a cross-sectional side view illustrations of an LED device in accordance with an embodiment of then invention.

FIG. 16A is a cross-sectional side-view illustration of an exemplary LED device 150 in accordance with an embodiment of the invention. As illustrated, the LED device 150 includes a p-n diode layer 105 including a top surface 162, a bottom surface 164, 166, external sidewalls 168 extending between the top surface 162 and the surrounding bottom surface 164, and a quantum well layer 108 between an n-doped layer 106 or 108 and a p-doped layer 106 or 108. A confinement trench 118 extends from the bottom surface 164, 166 of the p-n diode layer through the quantum well layer 108 and physically isolates an interior portion 152 of the quantum well layer 108 from a surrounding portion 154 of the quantum well layer adjacent the external sidewalls 168. In an embodiment, the inner portion 152 of the quantum well layer 108 corresponds to the confined current injection area of the LED device 150. A bottom electrically conductive contact 112 is on an in electrical contact with the interior bottom surface 166 of the p-n diode layer, and is not in electrical contact with the surrounding bottom surface 164 of the p-n diode layer.

Figure 16B:
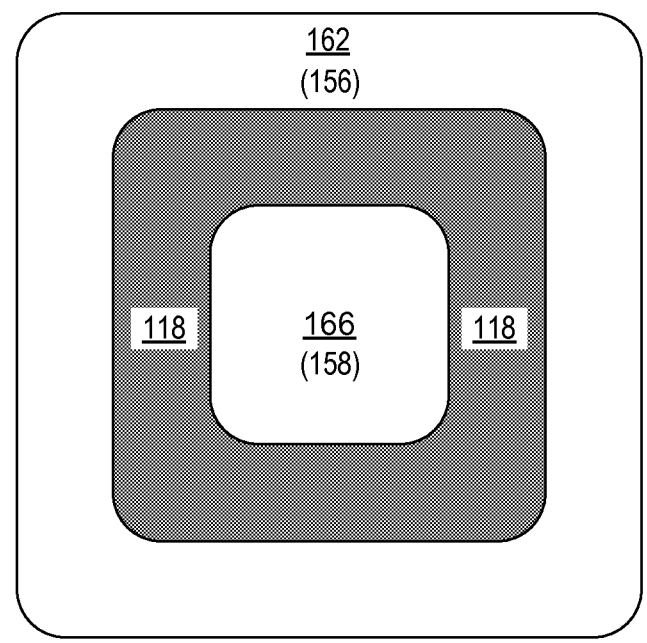
FIGS. 16B-16E are top-bottom combination schematic view illustrations LED devices in accordance with embodiments of the invention.

FIG. 16B is a top-bottom combination schematic view illustration of an exemplary LED device 150 in accordance with an embodiment of the invention. As illustrated, FIG. 16B combines certain features from both top and bottom views. Referring to FIG. 16B, in an embodiment, the confinement trench 118 surrounds the interior portion 152 of the quantum well layer 108. As shown, the interior portion 152 of the quantum well layer 108 is laterally separated from the surrounding portion 154 of the quantum well layer by confinement trench 118 so that the inner portion 152 of the quantum well layer 108 corresponds to the confined current injection area of the LED device 150. In an embodiment, top surface 162 of the p-n diode layer has a surface area 156 that is larger than a surface area 158 of the interior bottom surface 166 of the p-n diode layer surrounded by the confinement trench 118. As shown in FIGS. 15A-15B, in an embodiment, the LED device 150 is supported by a post 134 including a post surface area at a top surface of the post that is less than the surface area 158 of the interior bottom surface 166 of the p-n diode layer surrounded by the confinement trench 158.

Referring again to FIG. 16A, in an embodiment the mirror layer 126 spans along the interior bottom surface 166 of the p-n diode layer and along confinement trench sidewalls 119 within the confinement trench 118. In an embodiment the mirror layer 126 does not span along the external sidewalls 168 of the p-n diode layer. A passivation layer 122 may be located between the mirror layer 126 and the confinement trench sidewalls 119. In an embodiment, the passivation layer 122 spans along the external sidewalls 168 of the p-n diode layer. An opening may be formed in the passivation layer on the interior bottom surface 166 of the p-n diode layer. This may allow electrical connection to the bottom electrically conductive contact 112 and the interior bottom surface 166 of the p-n diode layer without allowing electrical connection to the surrounding bottom surface 164 of the p-n diode layer. The mirror layer 126, which may also be conductive, may be formed within the opening in the passivation layer 122 on the interior bottom surface 166 of the p-n diode layer.

In accordance with embodiments of the invention the LED devices 150 may be micro LED devices. In an embodiment, an LED device 150 has a maximum width or length at the top surface 162 of 300 μm or less, or more specifically approximately 100 μm or less. The active area within the LED device 150 may be smaller than the top surface 162 due to location of the confinement trenches 118. In an embodiment, the top surface 162 has a maximum dimension of 1 to 100 μm, or more specifically 3 to 20 μm. In an embodiment, a pitch of the array of LED devices 150 on the carrier substrate may be (1 to 300 μm) by (1 to 300 μm), or more specifically (1 to 100 μm) by (1 to 100 μm), for example, 20 μm by 20 μm, 10 μm by 10 μm, or 5 μm by 5 μm. In an exemplary embodiment, a pitch of the array of LED devices 150 on the carrier substrate is 11 μm by 11 μm. In such an exemplary embodiment, the width/length of the top surface 162 is approximately 9-10 μm, and spacing between adjacent LED devices 150 is approximately 1-2 μm. The interior bottom surface 166 may be approximately 3-4 μm, the confinement trench 118 surrounding the interior bottom surface 166 is approximately 1 μm, and each surrounding bottom surface 164 is approximately 2 μm. In such an embodiment the post 134 width/length is approximately 1-2 μm. It is to be appreciated that these dimensions are exemplary, and embodiments of the invention may be used to form LED devices of a variety of size scales.

Figure 16C:
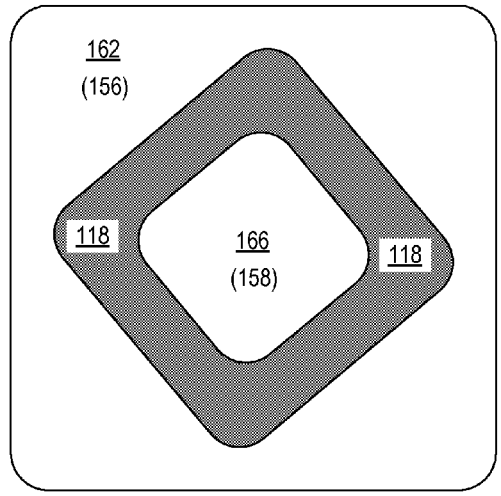
Figure 16D:
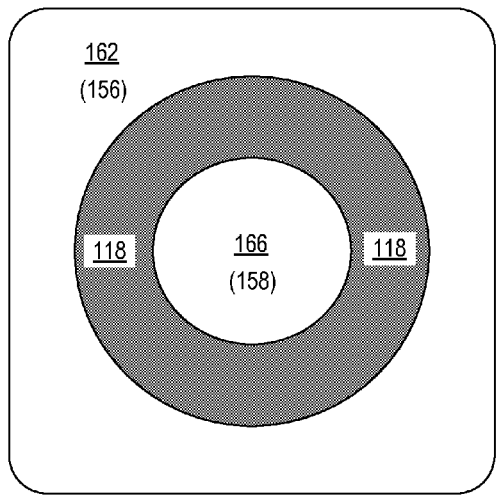
Figure 16E:
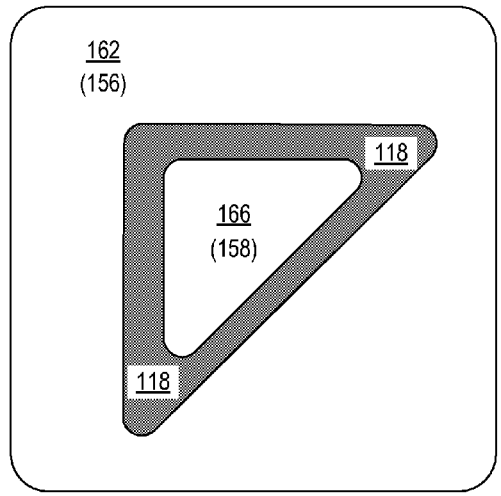

FIGS. 16C-16E are top-bottom combination schematic view illustrations of exemplary LED devices 150 in accordance with an embodiment of the invention. FIG. 16C is similar to FIG. 16B, with the confinement trenches 118 rotated 45 degrees with respect to the external sidewalls 168 of the p-n diode layer, though any rotational angle could be used. FIG. 16D illustrates an embodiment where unlike the square or rectangular confinement trench 118 pattern of FIGS. 16B-16C a circular confinement trench 118 pattern is used. It is believed a circular confinement trench pattern may result in less stress in the LED device 150. A circular confinement trench may additionally provide a higher current density due to smaller interior confinement area inside the confinement trench. FIG. 16E illustrates an embodiment with a triangular confinement trench 118 pattern. It is believed a triangular confinement trench pattern may provide a geometry for increased light extraction from side emission where the angles of the triangle may result in less internal reflection of light prior to exiting the LED device 150. In each of the embodiments illustrated in FIGS. 16B-16E a square or rectangular top surface 162 is maintained to match a square or rectangular electrostatic transfer head, however other geometries are possible.

In interests of clarity and conciseness, the above description of FIGS. 16A-16E was made with regard to the structure of FIG. 15A. Separate description and illustration is not provided with regard to the structure of FIG. 15B, though it is to be appreciated that similar processing sequences and structures are contemplated.

Figure 17A:
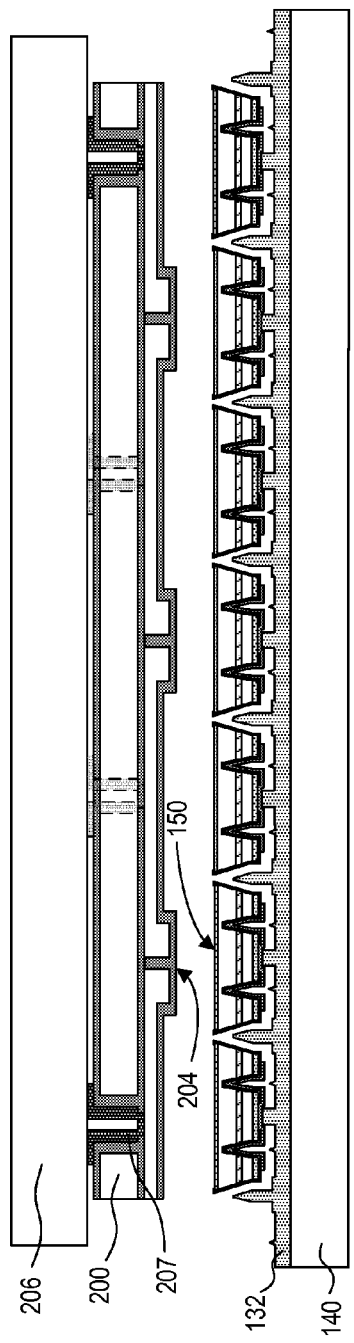
Figure 17B:
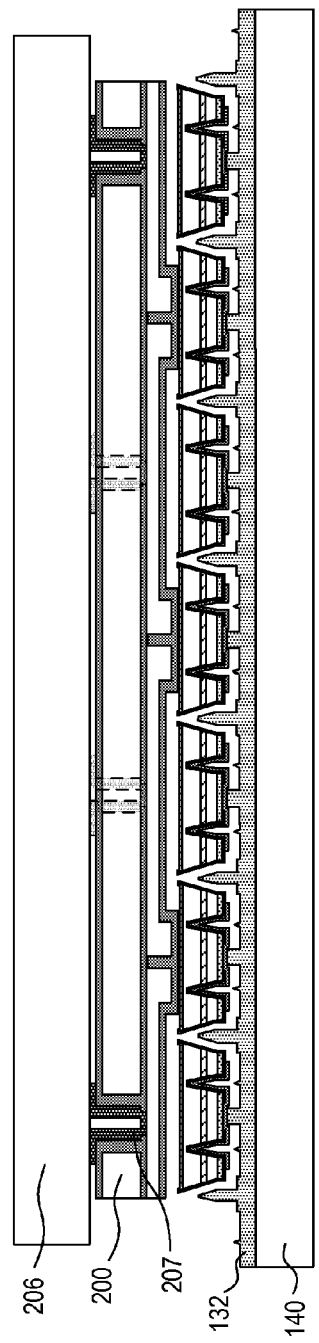
Figure 17E:
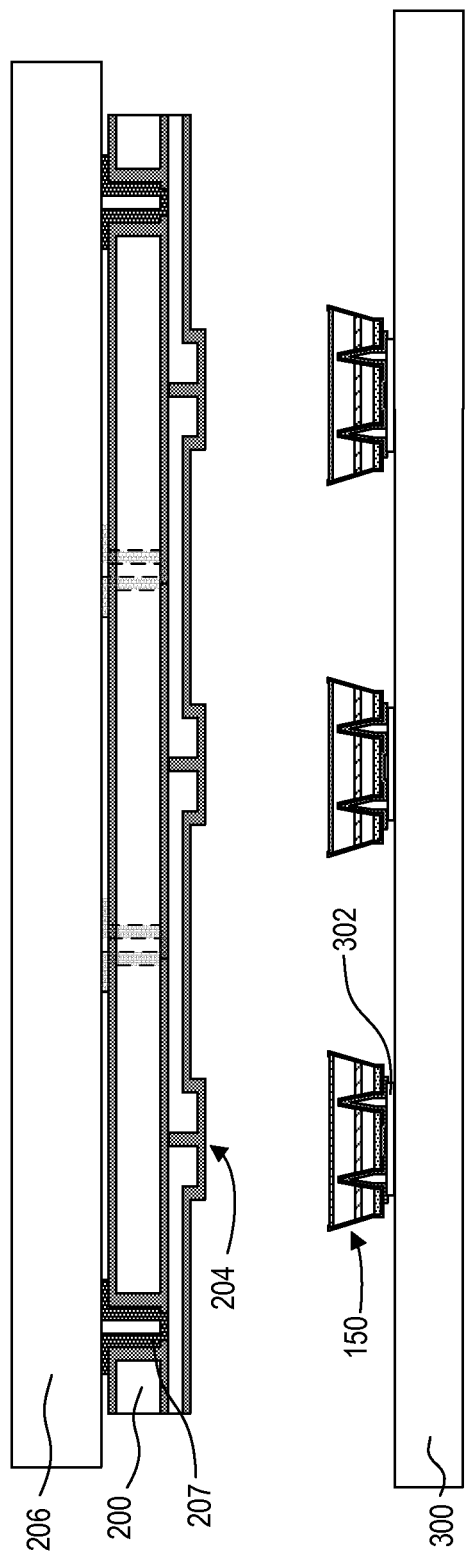

FIGS. 17A-17E are cross-sectional side view illustrations of an array of electrostatic transfer heads 204 transferring LED devices 150, which may be micro LED devices, from carrier substrate 140 to a receiving substrate 300 in accordance with an embodiment of the invention. FIG. 17A is a cross-sectional side view illustration of an array of micro device transfer heads 204 supported by substrate 200 and positioned over an array of LED devices 150 stabilized on stabilization posts 134 of stabilization layer 132 on carrier substrate 140. The array of LED devices 150 is then contacted with the array of transfer heads 204 as illustrated in FIG. 17B. As illustrated, the pitch of the array of transfer heads 204 is an integer multiple of the pitch of the array of LED devices 150. A voltage is applied to the array of transfer heads 204. The voltage may be applied from the working circuitry within a transfer head assembly 206 in electrical connection with the array of transfer heads through vias 207. The array of LED devices 150 is then picked up with the array of transfer heads 204 as illustrated in FIG. 17C. The array of LED devices 150 is then placed in contact with contact pads 302 (e.g. gold, indium, tin, etc.) on a receiving substrate 300, as illustrated in FIG. 17D. The array of LED devices 150 is then released onto contact pads 302 on receiving substrate 300 as illustrated in FIG. 17E. For example, the receiving substrate may be, but is not limited to, a display substrate, a lighting substrate, a substrate with functional devices such as transistors or ICs, or a substrate with metal redistribution lines.

In accordance with embodiments of the invention, heat may be applied to the carrier substrate, transfer head assembly, or receiving substrate during the pickup, transfer, and bonding operations. For example, heat can be applied through the transfer head assembly during the pick up and transfer operations, in which the heat may or may not liquefy LED device bonding layers. The transfer head assembly may additionally apply heat during the bonding operation on the receiving substrate that may or may not liquefy one of the bonding layers on the LED device or receiving substrate to cause diffusion between the bonding layers.

The operation of applying the voltage to create a grip pressure on the array of LED devices can be performed in various orders. For example, the voltage can be applied prior to contacting the array of LED devices with the array of transfer heads, while contacting the LED devices with the array of transfer heads, or after contacting the LED devices with the array of transfer heads. The voltage may also be applied prior to, while, or after applying heat to the bonding layers.

Where the transfer heads 204 include bipolar electrodes, an alternating voltage may be applied across a the pair of electrodes in each transfer head 204 so that at a particular point in time when a negative voltage is applied to one electrode, a positive voltage is applied to the other electrode in the pair, and vice versa to create the pickup pressure. Releasing the array of LED devices from the transfer heads 204 may be accomplished with a varied of methods including turning off the voltage sources, lower the voltage across the pair of electrodes, changing a waveform of the AC voltage, and grounding the voltage sources.

Figure 18A:
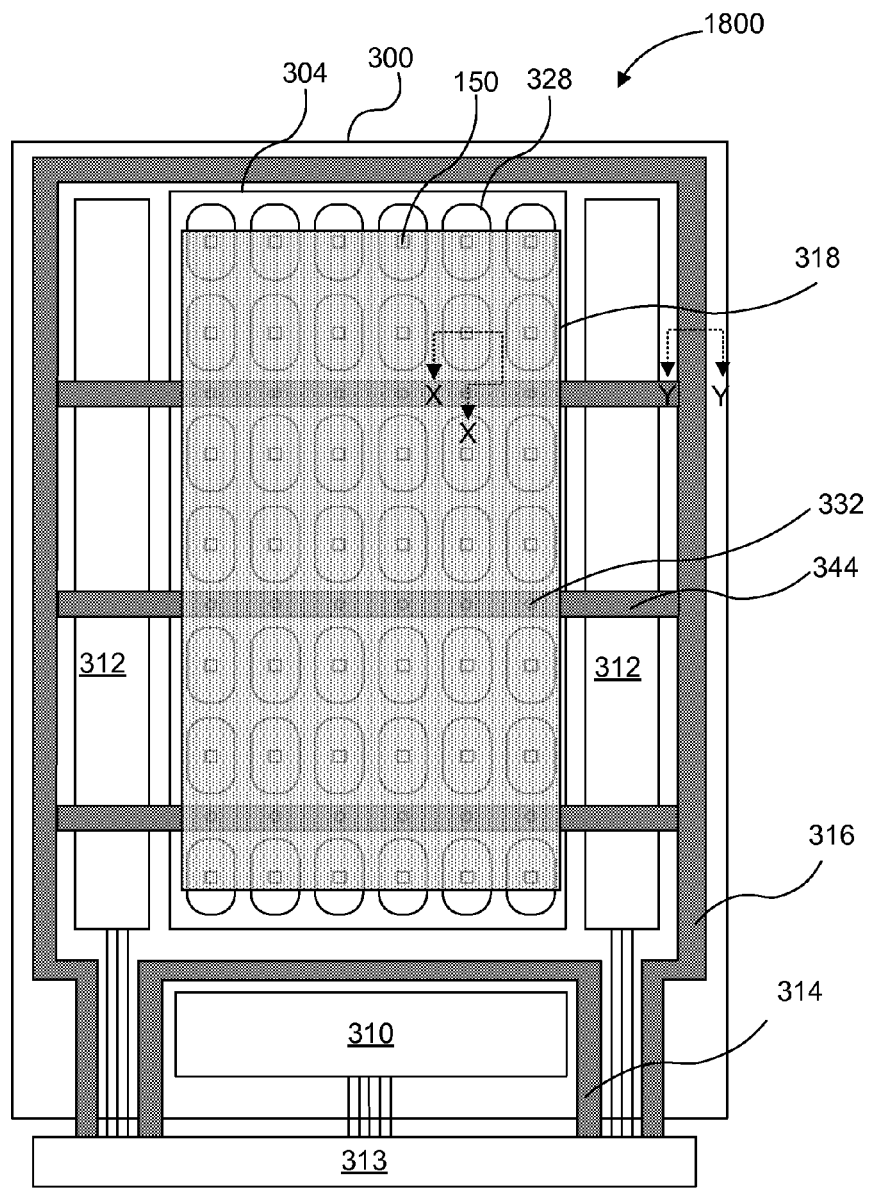
FIG. 18A is a top view illustration of a display panel in accordance with an embodiment of the invention.
Figure 18B:
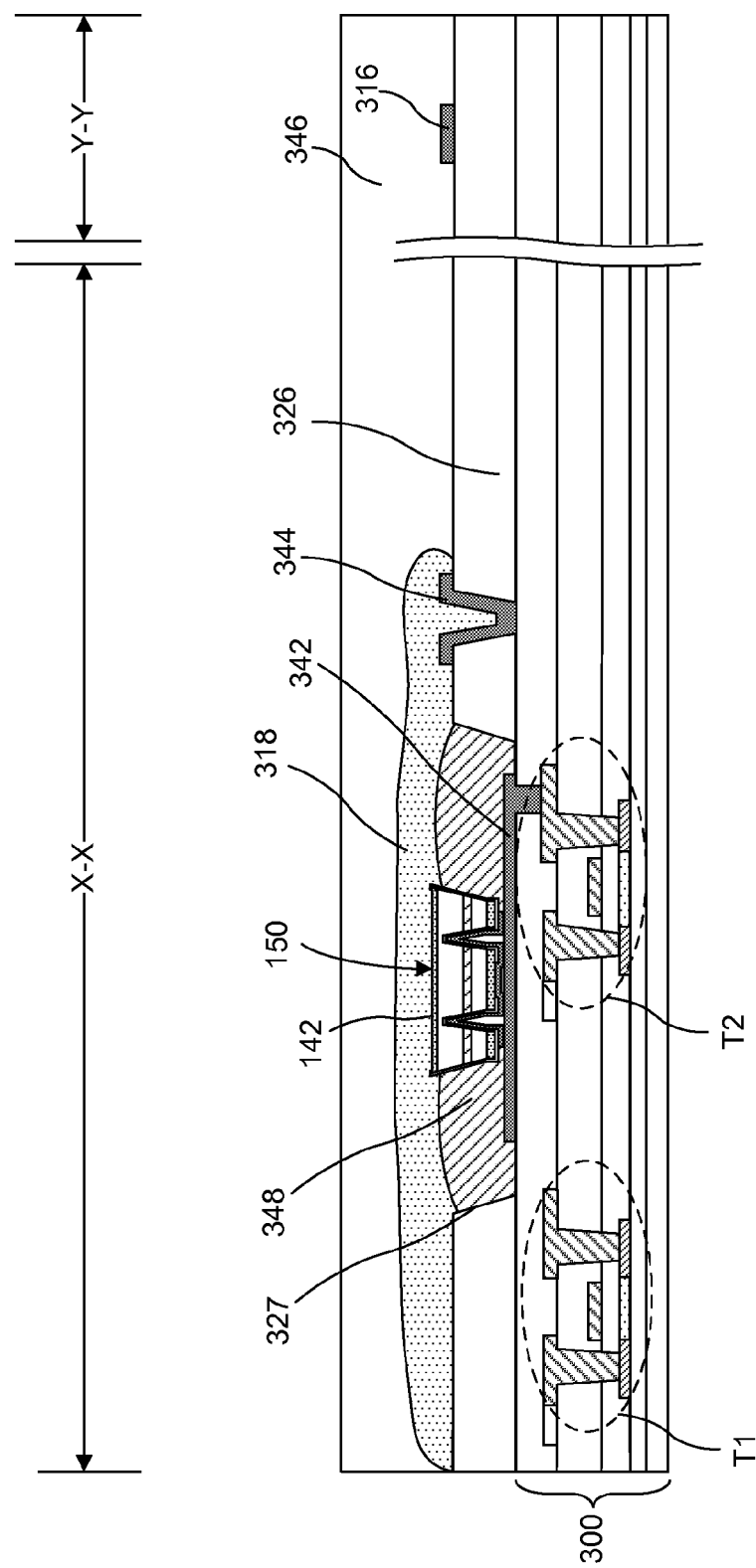
FIG. 18B is a side-view illustration of the display panel of FIG. 18A taken along lines X-X and Y-Y in accordance with an embodiment of the invention.

Referring now to FIGS. 18A-18B, in an embodiment, an array of LED devices is transferred and bonded to a display substrate. For example, the display substrate 302 may be a thin film transistor (TFT) display substrate (i.e. backplane) similar to those used in active matrix OLED display panels. FIG. 18A is a top view illustration of a display panel 1800 in accordance with an embodiment of the invention. FIG. 18B is a side-view illustration of the display panel 1800 of FIG. 18A taken along lines X-X and Y-Y in accordance with an embodiment of the invention. In such an embodiment, the underlying TFT substrate 300 may include working circuitry (e.g. transistors, capacitors, etc.) to independently drive each subpixel 328. Substrate 300 may include a non-pixel area and a pixel area 304 including subpixels 328 arranged into pixels. The non-pixel area may include a data driver circuit 310 connected to a data line of each subpixel to enable data signals (Vdata) to be transmitted to the subpixels, a scan driver circuit 312 connected to scan lines of the subpixels to enable scan signals (Vscan) to be transmitted to the subpixels, a power supply line 314 to transmit a power signal (Vdd) to the TFTs, and a ground ring 316 to transmit a ground signal (Vss) to the array of subpixels. As shown, the data driver circuit, scan driver circuit, power supply line, and ground ring are all connected to a flexible circuit board (FCB) 313 which includes a power source for supplying power to the power supply line 314 and a power source ground line electrically connected to the ground ring 316. It is to be appreciated, that this is one exemplary embodiment for a display panel, and alternative configurations are possible. For example, any of the driver circuits can be located off the display substrate 300, or alternatively on a back surface of the display substrate 300. Likewise, the working circuitry (e.g. transistors, capacitors, etc.) formed within the substrate 300 can be replaced with micro chips bonded to the top surface of the substrate 300.

In the particular embodiment illustrated, the TFT substrate 300 includes a switching transistor T1 connected to a data line from the driver circuit 310 and a driving transistor T2 connected to a power line connected to the power supply line 314. The gate of the switching transistor T1 may also be connected to a scan line from the scan driver circuit 312. A patterned bank layer 326 including bank openings 327 is formed over the substrate 300. In an embodiment, bank openings 327 correspond to subpixels 328. Bank layer 326 may be formed by a variety of techniques such as ink jet printing, screen printing, lamination, spin coating, CVD, PVD and may be formed of opaque, transparent, or semi-transparent materials. In an embodiment, bank layer 326 is formed of an insulating material. In an embodiment, bank layer is formed of a black matrix material to absorb emitted or ambient light. Thickness of the bank layer 326 and width of the bank openings 327 may depend upon the height of the LED devices 150 transferred to and bonded within the openings, height of the electrostatic transfer heads, and resolution of the display panel. In an embodiment, exemplary thickness of the bank layer 326 is between 1 µm-50 µm.

Electrically conductive bottom electrodes 342, ground tie lines 344 and ground ring 316 may optionally be formed over the display substrate 300. In the embodiments illustrated an arrangement of ground tie lines 344 run between bank openings 328 in the pixel area 304 of the display panel 1800. Ground tie lines 344 may be formed on the bank layer 326 or alternative, openings 332 may be formed in the bank layer 326 to expose ground tie lines 344 beneath bank layer 326. In an embodiment, ground tie liens 344 are formed between the bank openings 327 in the pixel area and are electrically connected to the ground ring 316 or a ground line in the non-display area. In this manner, the Vss signal may be more uniformly applied to the matrix of subpixels resulting in more uniform brightness across the display panel 1800.

A passivation layer 348 formed around the LED devices 150 within the bank openings 327 may perform functions such as preventing electrical shorting between the top and bottom electrode layers 318, 342 and providing for adequate step coverage of top electrode layer 318 between the top conductive contacts 142 and ground tie lines 344. The passivation layer 348 may also cover any portions of the bottom electrode layer 342 to prevent possible shorting with the top electrode layer 318. In accordance with embodiments of the invention, the passivation layer 348 may be formed of a bariety of materials such as, but not limited to epoxy, acrylic (polyacrylate) such as poly(methyl methacrylate) (PMMA), benzocyclobutene (BCB), polymide, and polyester. In an embodiment, passivation layer 348 is formed by ink jet printing or screen printing around the LED devices 150 to fill the subpixel areas defined by bank openings 327. In accordance with embodiments of the invention, the passivation layer 348 may be a black matrix material since the mirror is embedded within the LED device 150.

Top electrode layer 318 may be opaque, reflective, transparent, or semi-transparent depending upon the particular application. In top emission display panels the top electrode layer 318 may be a transparent conductive material such as amorphous silicon, transparent conductive polymer, or transparent conductive oxide. Following the formation of top electrode layer 318 and encapsulation layer 346 is formed over substrate 300. For example, encapsulation layer 346 may be a flexible encapsulation layer or rigid layer. In accordance with some embodiments of the invention, a circular polarizer may not be required to suppress ambient light reflection. As a result, display panels 1800 in accordance with embodiments of the invention may be packaged without a circular polarizer, resulting in increased luminance of the display panel.

In an embodiment, one or more LED devices 150 are arranged in a subpixel circuit. A first terminal (e.g. bottom conductive contact) of the LED device 150 is coupled with a driving transistor. For example, the LED device 150 can be bonded to a bonding pad coupled with the driving transistor.

In an embodiment, a redundant pair of LED devices 150 are bonded to the bottom electrode 342 that is coupled with the driving transistor T2. The one or more LED devices 150 may be any of the LED devices described herein including a confined current injection area, embedded mirror, and/or passivation layer. A ground line is electrically coupled with a second terminal (e.g. top conductive contact) for the one or more LED devices.

A current can be driven through the one or more LED devices, for example, from the driving transistor T2. In a high side drive configuration the one or more LED devices may be on the drain side of a PMOS driver transistor or a source side of an NMOS driver transistor so that the subpixel circuit pushes current through the p-terminal of the LED device. Alternatively, the subpixel circuit can be arranged in a low side drive configuration in which case the ground line becomes the power line and current is pulled through the n-terminal of the LED device.

In accordance with embodiments of the invention, the subpixel circuit may operate at comparatively low currents or current densities in the pre-droop range of the characteristic efficiency curve of the LED devices, or near a maximum efficiency value past the pre-droop range. Thus, rather than increasing the size of the LED devices to increase efficiency, the effective size of the current injection area is confined in order to increase the current density within the LED device. In embodiments where the LED devices are utilized in display applications, as opposed to high-powered applications, the LED devices can operate at comparatively lower current ranges, where a slight increase in current density may result in a significant improvement in IQE and EQE of the LED devices.

In an embodiment, a subpixel circuit comprises a driving transistor, a first terminal (e.g. bottom electrically conductive contact) of an LED device with confined current injection area is coupled with the driving transistor, and a ground line is coupled with a second terminal (e.g. top electrically conductive contact) of the LED device. In an embodiment, the LED device is operated by driving a current through the LED device in response to sending a control signal to the driving transistor. In some embodiments, the current may range from 1 nA-400 nA. In an embodiment, the current ranges from 1 nA-30 nA. In an embodiment, an LED device is operated with a current from 1 nA-30 nA in a display having a 400 pixel per inch (PPI) resolution. In an embodiment, the current ranges from 200 nA-400 nA. In an embodiment, an LED device is operated with a current from 200 nA-400 nA in a display having a 100 PPI resolution. In some embodiments, an LED device is operated with a confined current density from 0.001 $A/cm^2$ to 40 $A/cm^2$. In an embodiment, the current density ranges from 0.001 $A/cm^2$ to 3 $A/cm^2$. In an embodiment, such a current density range may be applicable to a display having a 400 PPI resolution. In an embodiment, the current density ranges from 0.2 $A/cm^2$ to 4 $A/cm^2$. In an embodiment, such a current density range may be applicable to a display having a 100 PPI resolution.

The following examples are provided to illustrate the effect of current confinement, and the relationship of efficiency, current and current density for LED devices in accordance with embodiments of the invention. In accordance with embodiments of the invention, a designer may select a desired efficiency and luminance of an LED device with a characteristic efficiency curve, such as the exemplary efficiency curve illustrated in FIG. 21. Upon selecting the desired efficiency and luminance, the designer may tune the operating current and size of the confined current injection area within the LED device to achieve the desired efficiency.

Example 1

In one embodiment, a display panel is a 5.5 inch full high definition display with 1920×1800 resolution, and 400 pixels per inch (PPI) including a 63.5 µm RGB pixel size. To achieve a 300 Nit output (white) with LED devices having a 10% EQE, the display panel uses approximately 10 nA-30 nA of current per LED, assuming one LED per subpixel. For an LED device with a 10 µm×10 µm confined current injection area this corresponds to a current density of 0.01 $A/cm^2$-0.03 $A/cm^2$. This is well below the normal or designed operating conditions for standard LEDs.

Example 2

In an embodiment, the parameters of Example 1 are the same, with a smaller 1 µm×1 µm confined current injection area. With this reduced current injection area the corresponding current density increases to 1 $A/cm^2$-3 $A/cm^2$. Thus, Example 2 illustrates that at operating currents of 10 nA-30 nA, small changes in current injection area from 10 µm×10 µm to 1 µm×1 µm can have a significant effect on current density. In turn, the change in current density may affect efficiency of the LED device.

Example 3

In one embodiment, a display panel is a 5.5 inch full high definition display with 1920×1800 resolution, and 400 pixels per inch (PPI) including a 63.5 µm RGB pixel size. Each subpixel includes an LED device with a 10 µm×10 µm confined current injection area. Luminance is maintained at 300 Nit output (white). In this example, it is desired to achieve a 40% EQE. With this increased efficiency, lower operating currents may be used. In an embodiment, an operating current of 3 nA-6 nA per LED is selected. With these parameters an LED device with a 10 µm×10 µm confined current injection area operates at 0.003 $A/cm^2$-0.006 $A/cm^2$, and an LED device with a 1 µm×1 µm confined current injection area operates at 0.3 $A/cm^2$-0.6 $A/cm^2$.

Example 4

In one embodiment, a display panel is a 5.5 inch display with a lower resolution of 100 PPI including a 254 µm RGB pixel size. To achieve a 300 Nit output (white) with LED devices having a 10% EQE, the display panel uses a higher operating current of approximately 200 nA-400 nA of current per LED, assuming one LED per subpixel. For an LED device with a 10 µm×10 µm confined current injection area this corresponds to a current density of 0.2 $A/cm^2$-0.4 $A/cm^2$. A 1 µm×1 µm confined current injection area corresponds to a current density of 20 $A/cm^2$-40 $A/cm^2$, and a 3 µm×3 µm confined current injection area corresponds to a current density of 2 $A/cm^2$-4 $A/cm^2$. Thus, Example 4 illustrates that with lower resolution displays, there is a smaller density of LED devices, and higher operating currents are used to achieve a similar brightness (300 Nit) as higher resolution displays.

Example 5

In one embodiment, a display panel has 716 PPI including a 35 µm RGB pixel size. To achieve a 300 Nit output (white) with LED devices having a 10% EQE, the display panel uses an operating current of approximately 4-7 nA. With these parameters an LED device with a 10 µm×10 µm confined current injection area operates at 0.004 $A/cm^2$-0.007 $A/cm^2$, and an LED device with a 1 µm×1 µm confined current injection area operates at 0.4 $A/cm^2$-0.7 $A/cm^2$.

Example 6

In another embodiment the required brightness of the display is increased to 3000 Nit. In all examples above the required current would increase about 10× if the same EQE is targeted. Subsequently, the current density would also increase 10× for the above examples. In one embodiment the required operating brightness is a range from 300 Nit to 3000 Nit. The current and subsequently the current density would span a range of 1-10× the 300 Nit range. In the case of Examples 1 and 2 (above) where now 300 Nit to 3000 Nit is required, an LED device with a 10 µm×10 µm confined current injection area operates at a current density of 0.01 $A/cm^2$-0.3 $A/cm^2$ and an LED device with a 1 µm×1 µm confined current injection area operates at 1 $A/cm^2$-30 $A/cm^2$.

In each of the above exemplary embodiments, the brightness of the display is such that the LED devices are operating at very low current densities that are not typical of standard LEDs. The typical performance of standard LEDs show low IQEs at current densities below 1 $A/cm^2$. In accordance with embodiments of the invention, the current injection area is confined such that the current density can be increased to allow operation of the LED devices in a current density regime where IQE, and EQE, are optimized.

Figure 19:
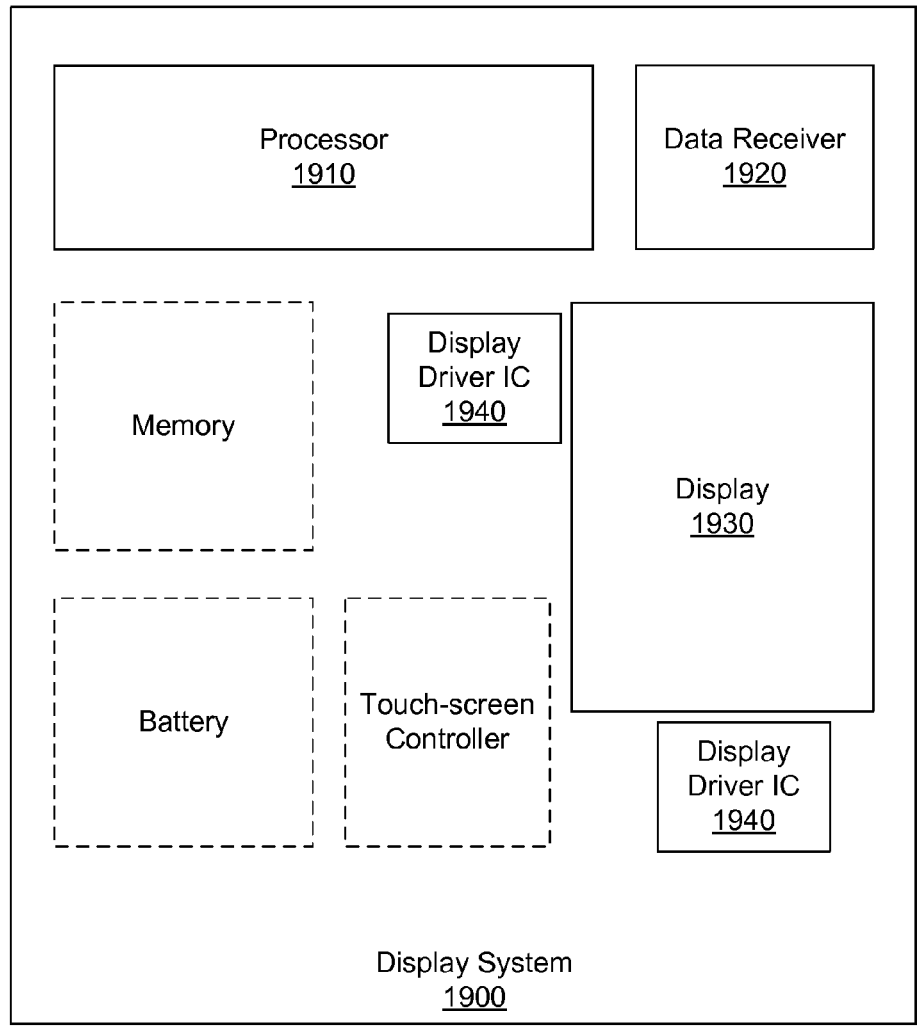
FIG. 19 is a schematic illustration of a display system in accordance with an embodiment of the invention.

FIG. 19 illustrates a display system 1900 in accordance with an embodiment. The display system houses a processor 1910, data receiver 1920, a display 1930, and one or more display driver ICs 1940, which may be scan driver ICs and data driver ICs. The data receiver 1920 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The one or more display driver ICs 1940 may be physically and electrically coupled to the display 1930.

In some embodiments, the display 1930 includes one or more LED devices 150 that are formed in accordance with embodiments of the invention described above. Depending on its applications, the display system 1900 may include other components. These other components include, but are not limited to, memory, a touch-screen controller, and a battery. In various implementations, the display system 1900 may be a television, tablet, phone, laptop, computer monitor, kiosk, digital camera, handheld game console, media display, ebook display, or large area signage display.

Figure 20:
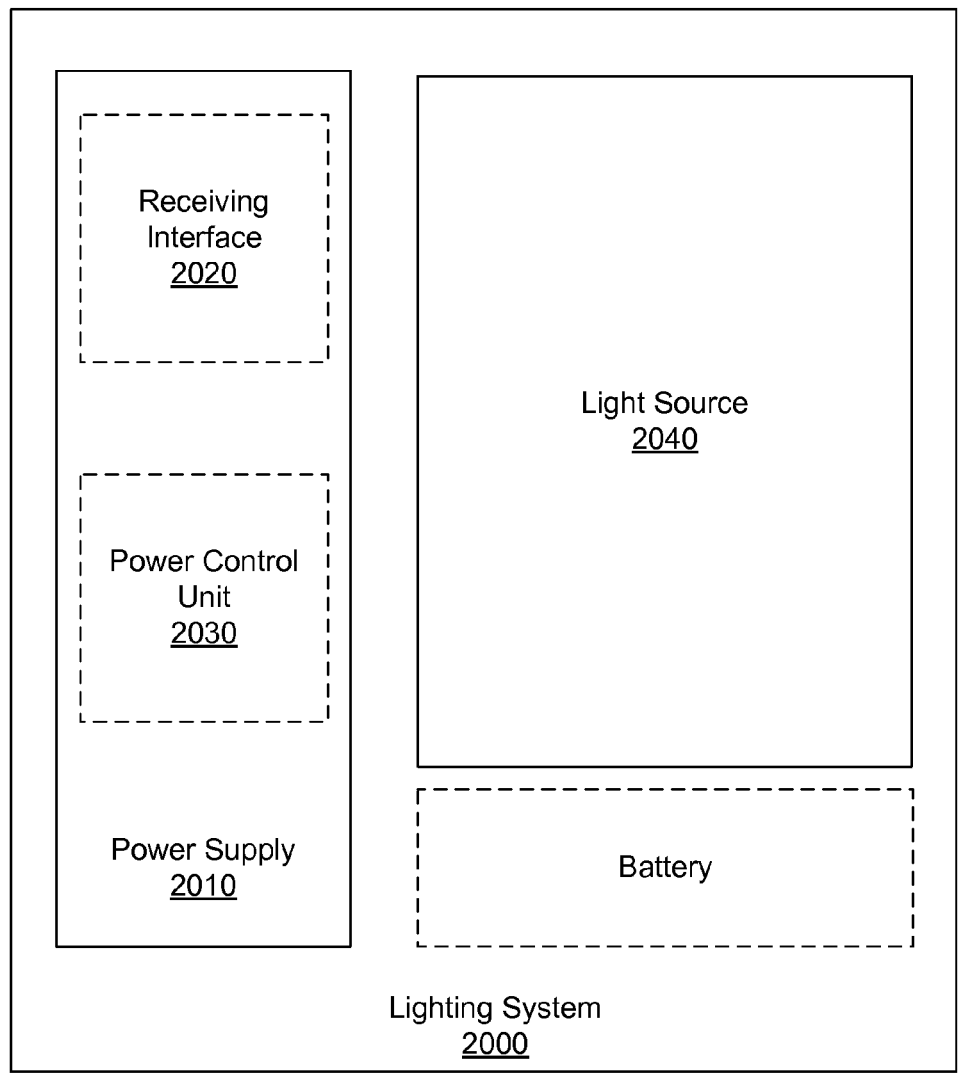
FIG. 20 is a schematic illustration of a lighting system in accordance with an embodiment of the invention.

FIG. 20 illustrates a lighting system 2000 in accordance with an embodiment. The lighting system houses a power supply 2010, which may include a receiving interface 2020 for receiving power, and a power control unit 2030 for controlling power to be supplied to the light source 2040. Power may be supplied from outside the lighting system 2000 or from a battery optionally included in the lighting system 2000. In some embodiments, the light source 2040 includes one or more LED devices 150 that are formed in accordance with embodiments of the invention described above. In various implementations, the lighting system 2000 may be interior or exterior lighting applications, such as billboard lighting, building lighting, street lighting, light bulbs, and lamps.

In utilizing the various aspects of this invention, it would become apparent to one skilled in the art that combinations or variations of the above embodiments are possible for forming an LED device including any one of a confined current injection area, embedded mirror, or passivation layer. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. An LED device comprising:
    a p-n diode layer comprising:
        a top surface with a maximum dimension of 3 to 20 µm,
        a bottom surface comprising an interior bottom surface and a surrounding bottom surface;
        external sidewalls extending between the top surface and the surrounding bottom surface;
        a quantum well layer between an n-doped layer and a p-doped layer;
    a confinement trench that extends from the bottom surface of the p-n diode layer through the quantum well layer and physically isolates an interior portion of the quantum well layer from a surrounding portion of the quantum well layer adjacent the external sidewalls, and the confinement trench physically isolates an interior bottom surface of the p-n diode layer from a surrounding bottom surface of the p-n diode layer adjacent the external sidewalls, wherein the surrounding bottom surface of the p-n diode completely surrounds the interior bottom surface of the p-n diode layer;
    a bottom electrically conductive contact on and in electrical contact with the interior bottom surface of the p-n diode layer, wherein the bottom electrically conductive contact that is on and in electrical contact with the interior bottom surface of the p-n diode layer is not in electrical contact with the surrounding bottom surface of the p-n diode layer that completely surrounds the interior bottom surface of the p-n diode layer;
    wherein the LED device is bonded to a bottom electrode of a subpixel within a display area of a display substrate, and the bottom electrically conductive contact is in electrical contact with the bottom electrode; and
    a top electrode that is on and in electrical contact with the top surface, and the top electrode completely covers the top surface.

2. The LED device of claim 1, further comprising a mirror layer spanning along the interior bottom surface and along confinement trench sidewalls within the confinement trench.

3. The LED device of claim 2, wherein the mirror layer does not span along the external sidewalls of the p-n diode layer.

4. The LED device of claim 2, further comprising a passivation layer between the mirror layer and the confinement trench sidewalls.

5. The LED device of claim 4, wherein the passivation layer spans along the external sidewalls of the p-n diode layer.

6. The LED device of claim 4, further comprising an opening in the passivation layer on the interior bottom surface of the p-n diode layer.

7. The LED device of claim 6, wherein the mirror layer is formed within the opening of the passivation layer on the interior bottom surface of the p-n diode layer.

8. The LED device of claim 1, wherein a top surface area of the top surface of the p-n diode layer is larger than a surface area of the interior bottom surface of the p-n-diode layer surrounded by the confinement trench.

9. The LED device of claim 1, wherein the display substrate is incorporated within portable electronic device.

* * * * *